US008610516B2

(12) United States Patent
Umeda

(10) Patent No.: US 8,610,516 B2
(45) Date of Patent: Dec. 17, 2013

(54) PIEZOELECTRIC THIN-FILM FILTER

(75) Inventor: Keiichi Umeda, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 616 days.

(21) Appl. No.: 12/547,633

(22) Filed: Aug. 26, 2009

(65) Prior Publication Data

US 2010/0013573 A1  Jan. 21, 2010

Related U.S. Application Data

(63) Continuation of application No. PCT/JP2008/052770, filed on Feb. 19, 2008.

(30) Foreign Application Priority Data

Apr. 11, 2007  (JP) ................................. 2007-103531

(51) Int. Cl.
*H03H 9/15* (2006.01)
*H03H 9/54* (2006.01)

(52) U.S. Cl.
USPC .......................................... 333/187; 333/189

(58) Field of Classification Search
USPC ................................... 333/187, 189
See application file for complete search history.

(56) References Cited

U.S. PATENT DOCUMENTS

| | | | |
|---|---|---|---|
| 5,726,610 A * | 3/1998 | Allen et al. | 333/133 |
| 6,215,375 B1 | 4/2001 | Larson, III et al. | |
| 6,788,170 B1 * | 9/2004 | Kaitila et al. | 333/187 |
| 6,842,088 B2 * | 1/2005 | Yamada et al. | 333/187 |
| 7,161,448 B2 * | 1/2007 | Feng et al. | 333/187 |
| 7,280,007 B2 * | 10/2007 | Feng et al. | 333/187 |
| 7,388,454 B2 * | 6/2008 | Ruby et al. | 333/187 |
| 7,636,027 B2 * | 12/2009 | Mori et al. | 333/189 |

(Continued)

FOREIGN PATENT DOCUMENTS

| | | |
|---|---|---|
| JP | 2000-332568 A | 11/2000 |
| JP | 2002-198777 A | 7/2002 |
| JP | 2004-158970 A | 6/2004 |

(Continued)

OTHER PUBLICATIONS

Rudolf F. Graf, Modern Dictionary of Electronics, year 1999, Butterworth-Heinemann, p. 284.*
Official Communication issued in International Patent Application No. PCT/JP2008/052770, mailed on May 13, 2008.

*Primary Examiner* — Dean O Takaoka
*Assistant Examiner* — Alan Wong
(74) *Attorney, Agent, or Firm* — Keating & Bennett, LLP

(57) ABSTRACT

A piezoelectric thin-film filter reduces insertion loss and deterioration of steepness of a shoulder characteristic and reduces the ripple in the passband. In a first vibration portion, a piezoelectric thin film is disposed between a pair of electrodes along one main surface of a substrate. In a second vibration portion, the piezoelectric thin film is disposed between a pair of electrodes along the one main surface of the substrate. The vibration portions are both acoustically isolated from the substrate. In the first resonator, an additional film is disposed outside the electrode constituting half or more the overall length of the perimeter of the first vibration portion that is in contact with the electrode when seen from a thickness direction. In the second resonator, the external shape of the vibration portion when seen from a thickness direction is a polygon, and each side of the polygon is not parallel with any of the other sides thereof.

14 Claims, 21 Drawing Sheets

(56) References Cited

U.S. PATENT DOCUMENTS

| | | | |
|---|---|---|---|
| 7,649,304 B2 * | 1/2010 | Umeda et al. | 310/320 |
| 2002/0093394 A1 | 7/2002 | Tikka et al. | |
| 2003/0227366 A1 | 12/2003 | Lin | |
| 2004/0085160 A1 | 5/2004 | Nishimura et al. | |
| 2005/0146242 A1 | 7/2005 | Inoue | |

FOREIGN PATENT DOCUMENTS

| | | |
|---|---|---|
| JP | 2005-184303 A | 7/2005 |
| WO | 2006/129532 A1 | 12/2006 |

* cited by examiner

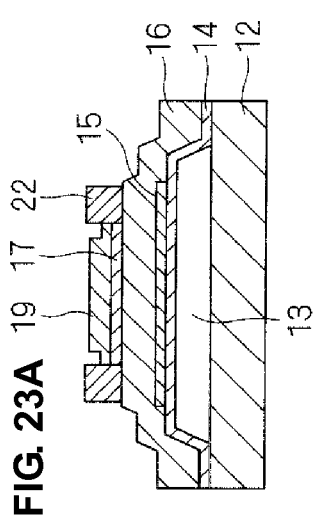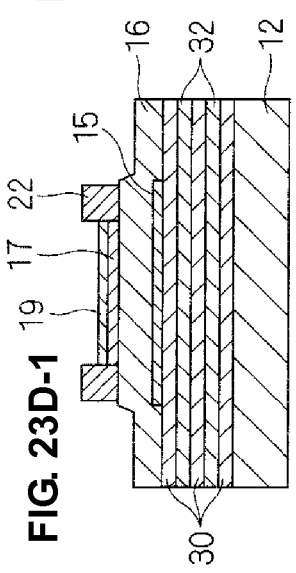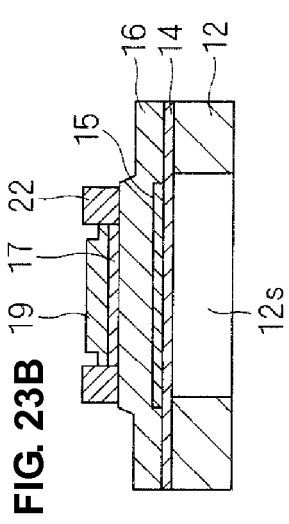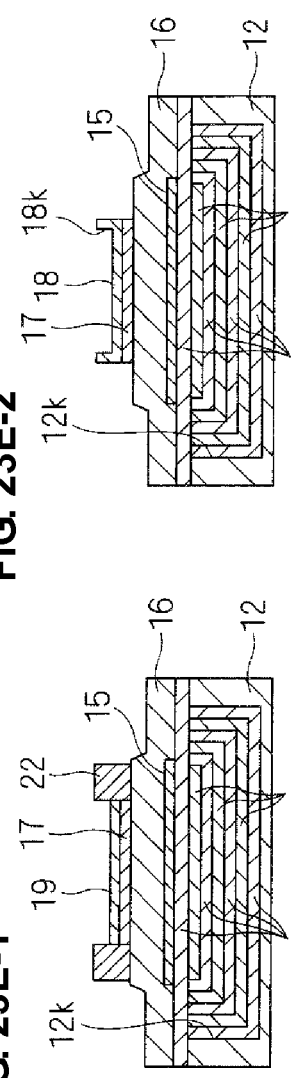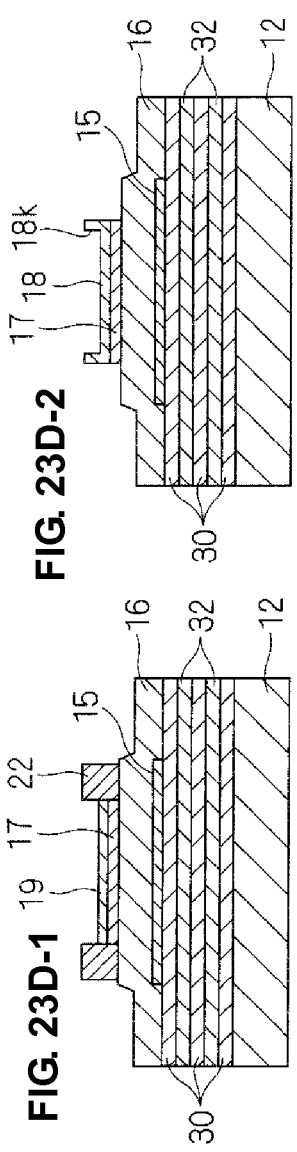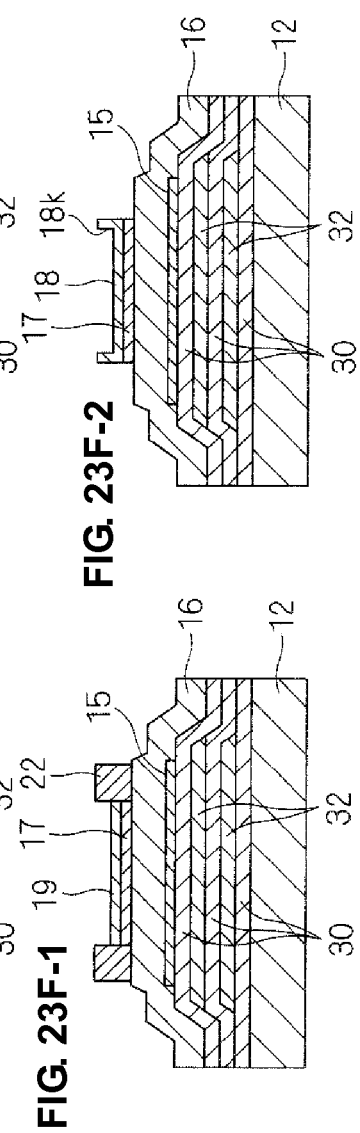

PIEZOELECTRIC THIN-FILM FILTER

BACKGROUND OF THE INVENTION

1. Field of the Invention

The present invention relates to a piezoelectric thin-film filter, more specifically, a piezoelectric thin-film filter where a vibration portion in which a piezoelectric thin film is interposed between a pair of electrodes is supported in such a manner that the vibration portion is acoustically isolated from a substrate.

2. Description of the Related Art

There have been proposed various configurations to improve characteristics of a piezoelectric thin-film filter where a vibration portion in which a piezoelectric thin film is interposed between a pair of electrodes is supported in such a manner that the vibration portion is acoustically isolated from a substrate.

For example, Japanese Unexamined Patent Application Publication No. 2000-332568 proposes that in order to restrain irregular vibration generated in a lateral resonance mode, an electrode be formed as shown in a plan view of FIG. 27 so that the external shape of a vibration portion 100 when seen from a thickness direction is a non-square, irregular shape.

International Disclosure 2006/129532 proposes that in order to reduce spurious responses, a vibration portion 110 seen from a thickness direction take the shape of an approximate polygon, and perimeters 114a, 116a, 116s, and 116t of electrodes 114 and 116 be formed into waves so that each side of the approximate polygon takes the shape of a wave that is repeatedly bent or folded, like a triangle wave, a square wave, or a sine wave, as shown in a plan view of FIG. 28.

Also, as shown in a plan view of FIG. 29, US Patent Application Publication 2003/0227366 proposes that in order to reduce ripples in a filter, different aspect ratios should be set for all resonators forming the filter.

If a vibration portion having an asymmetrical shape, as described in Japanese Unexamined Patent Application Publication No. 2000-332568, is formed and Lamb waves are dispersed in the vibration portion, a loss unavoidably occurs and the characteristics of a resonator formed by this method has problems for a filter application. Because, among filter characteristics, the insertion loss is increased and the steepness of the shoulder characteristic of the filter is deteriorated.

Also, if a vibration portion having a perimeter taking the shape of periodic waves, as described in International Disclosure 2006/129532, is formed and Lamb waves are dispersed in the vibration portion, a loss occurs unavoidably and the characteristics of a resonator formed by this method has problems for a filter application. Because, among the filter characteristics, the insertion loss is increased and the steepness of the shoulder characteristic of the filter is deteriorated.

Also, if different aspect ratios are set for resonators as described in US Patent Application Publication 2003/0227366, spurious responses in resonators having a rectangular plan view shape are extremely large. The setting of different aspect ratios is not sufficient to reduce the ripples.

SUMMARY OF THE INVENTION

Accordingly, preferred embodiments of the present invention provide a piezoelectric thin-film filter that reduces the insertion loss and deterioration of the steepness of the shoulder characteristic and reduces ripples in the passband.

A preferred embodiment of the present invention provides a piezoelectric thin-film filter including a substrate and first and second vibration portions, in each of which a piezoelectric thin film is disposed between a pair of electrodes along one main surface of the substrate and which are each acoustically isolated from the substrate. The piezoelectric thin-film filter is preferably configured by combining a first resonator including the first vibration portion and a second resonator including the second vibration portion. The first resonator has an additional film that is disposed outside of the one of the electrodes, the one of the electrodes constituting half or more the overall length of the perimeter of the first vibration portion, in contact with the one of the electrodes when seen from a thickness direction. The external shape of the second vibration portion of the second resonator when seen from a thickness direction preferably is a polygon, and each side of the polygon is not parallel with any of the other sides thereof.

In the above-mentioned configuration, the first resonator including the first vibration portion and additional film, carries spurious that remains at or below the resonance frequency and large ripple in the filter passband. The second resonator including the second vibration portion having an irregular or asymmetrical plan view shape, has increased insertion loss and deteriorated steepness of the shoulder characteristic of the filter.

According to the above-mentioned configuration, by combining the first resonator and second resonator, it is possible to reduce the insertion loss and deterioration of the steepness of the shoulder characteristic and reduce the ripple in the passband.

A preferred embodiment of the piezoelectric thin-film filter includes a substrate and first and second vibration portions, in each of which a piezoelectric thin film is disposed between a pair of electrodes along one main surface of the substrate and which are each acoustically isolated from the substrate. The piezoelectric thin-film filter is configured by combining a first resonator including the first vibration portion and a second resonator including the second vibration portion. The first resonator has an additional film that is disposed outside one of the electrodes, which constitutes half or more the overall length of the perimeter of the first vibration portion, in contact with the one of the electrodes when seen from a thickness direction. The external shape of the second vibration portion of the second resonator when seen from a thickness direction is an approximate polygon, and each side of the approximate polygon takes the shape of a wave that is repeatedly bent or folded.

In the above-mentioned configuration, the first resonator including the first vibration portion and additional film, carries spurious that remains at or below the resonance frequency and large ripple in the filter passband. The second resonator including the second vibration portion having a perimeter having the shape of a wave, has increased insertion loss and deteriorated steepness of the shoulder characteristic of the filter.

According to the above-mentioned configuration, by combining the first resonator and second resonator, it is possible to reduce the insertion loss and deterioration of the steepness of the shoulder characteristic and reduce the ripple in the passband.

The piezoelectric thin-film filters having the above-mentioned configurations may be configured more specifically as follows.

The first resonator preferably has a relatively small characteristic impedance. The second resonator preferably has a relatively large characteristic impedance.

In this case, by combining the first resonator having a relatively small characteristic impedance and the second resonator having a relatively large characteristic impedance, a piezoelectric thin-film filter having better characteristics can be obtained.

Preferably, the first resonator has a relatively small characteristic impedance. The second resonator preferably has a relatively large characteristic impedance. At least one second resonator is preferably replaced with the plurality of first resonators coupled in series.

In this case, by replacing at least one second resonator with the first resonators having spurious smaller than that of the second resonator, it is possible to obtain a piezoelectric thin-film filter having a low insertion loss and a steep shoulder characteristic. Also, since power applied to the resonator is reduced, the filter is excellent in power resistance.

Preferably, the first resonator has a relatively low resonance frequency. The second resonator has a relatively high resonance frequency.

In this case, it is possible to obtain a piezoelectric thin-film filter having better characteristics than those in a case where the first resonator has a relatively high resonance frequency and the second resonator has a relatively low resonance frequency.

The piezoelectric thin-film filter preferably further includes a step-formed film overlaid on at least one of the first and second vibration portions when seen from a thickness direction, the step-formed film including a step portion formed along at least a portion of a perimeter of the vibration portion, a thickness of the step-formed film between the step portion and the perimeter of the vibration portion being smaller than thicknesses of the other portions of the step-formed film.

In this case, by including the step-formed film, spurious of the piezoelectric thin-film filter can be improved.

The piezoelectric thin-film filter preferably further includes a step-formed film overlaid on only the vibration portion of a resonator having a relatively high characteristic impedance among resonators forming a filter. When seen from a thickness direction, the step-formed film including a step portion is formed along at least a portion of a perimeter of the vibration portion, and a thickness of the step-formed film between the step portion and the perimeter of the vibration portion being smaller than thicknesses of the other portions of the step-formed film.

A problem with a filter including a resonator having a higher characteristic impedance is spurious. Therefore, by including the step-formed film, spurious can be improved.

The piezoelectric thin-film filter according to various preferred embodiments of the present invention can reduce the insertion loss and deterioration of the steepness of the shoulder characteristic and can reduce the ripple in the passband.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 3A-1, 3A-2, 3B-1 and 3B-2 include perspective views of the piezoelectric thin-film filter according to a second preferred embodiment of the present invention.

FIGS. 10A-1, 10A-2, 10B-1, and 10B-2 include perspective view and diagrams of resonators according to the fourth preferred embodiment of the present invention.

FIGS. 15A-1, 15A-2, 15B-1, 15B-2, and 15B-3 include perspective views of resonators according to the fifth preferred embodiment of the present invention.

FIGS. 23A, 23B, 23C, 23D-1, 23D-2, 23E-1, 23E-2, 23F-1, and 23F-2 include sectional views of piezoelectric thin-film filters according to a ninth preferred embodiment of the present invention.

DETAILED DESCRIPTION OF THE PREFERRED EMBODIMENTS

Hereafter, first to twelfth preferred embodiments, which are preferred embodiments of the present invention, will be described with reference to FIGS. 1 to 26.

First Preferred Embodiment

A piezoelectric thin-film filter 10 according to the first preferred embodiment will be described with reference to FIGS. 1 to 6B.

Figure 1:
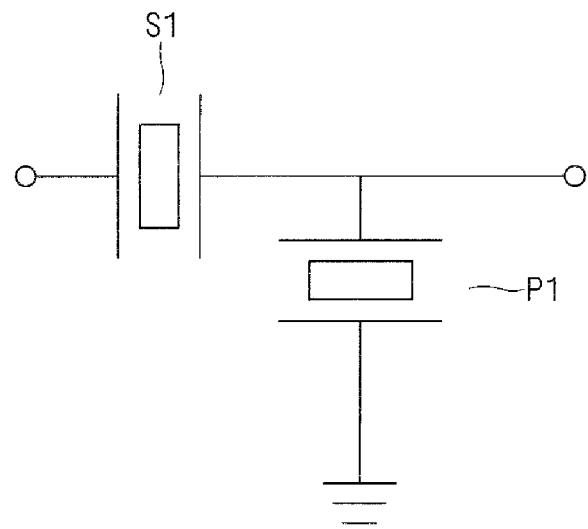
FIG. 1 is a circuit diagram of a piezoelectric thin-film filter according to a first preferred embodiment of the present invention.

As shown in a circuit diagram of FIG. 1, the piezoelectric thin-film filter 10 according to the first preferred embodiment includes a ladder-type filter(s) including a series resonator S1 and a parallel resonator P1 and provided in one or two or more stages.

That is, in the piezoelectric thin-film filters 10, using the one stage shown in FIG. 1 as a basic unit, the ladder-type filters are provided in multiple stages and cascade-connected as necessary in accordance with the specification. An inductor may be connected to a resonator in series.

Figure 2:
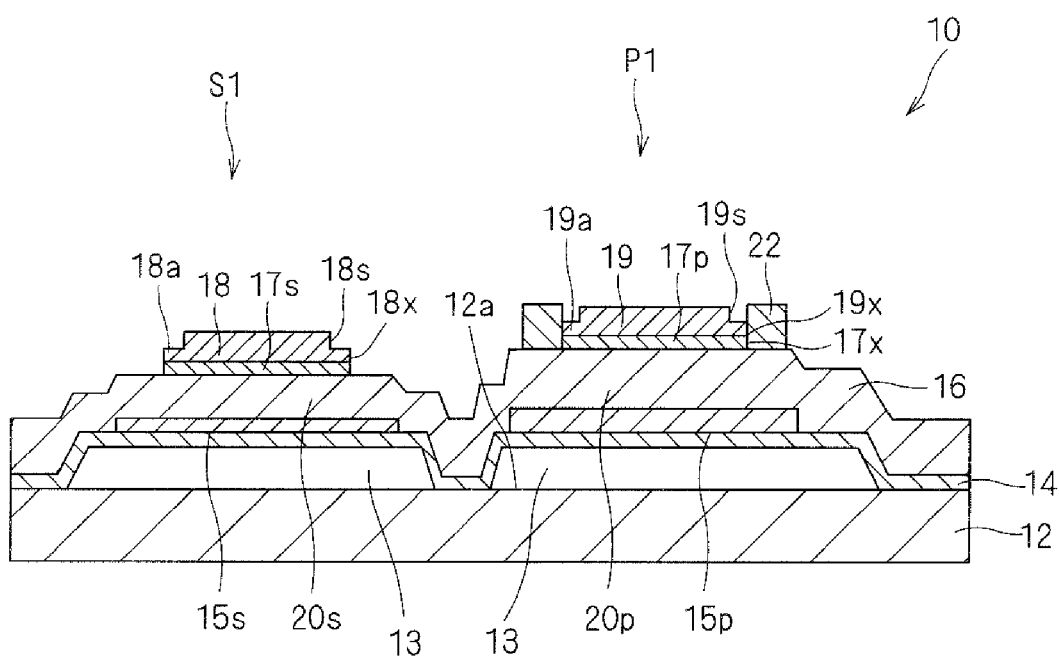
FIG. 2 is a sectional view of the piezoelectric thin-film filter according to the first preferred embodiment of the present invention.

The series resonator S1 and parallel resonator P1 are configured as shown in a sectional view of FIG. 2.

A supporting layer 14, lower electrodes 15s and 15p, a piezoelectric thin film 16, upper electrodes 17s and 17p, frequency adjustment films 18 and 19, and an additional film 22 are laminated on a top surface 12a, which is one main surface of a substrate 12. A vibration portion 20s where the piezoelectric thin film 16 is interposed between the upper electrode 17s and lower electrode 15s, the vicinity of the vibration portion 20s, where the piezoelectric thin film 16 is interposed between the upper electrode 17p and lower electrode 15p, and the vicinity of the vibration portion 20p, are separated from the substrate 12 with gaps 13 interposed therebetween and are acoustically isolated from the substrate 12. The resonators S1 and P1 preferably are piezoelectric thin-film resonators using thickness vibration of the piezoelectric thin film 16 in the vibration portions 20s and 20p. The gaps 13 can be formed by forming a sacrificial layer on the top surface 12a of the substrate 12, forming the resonators S1 and P1 on the sacrificial layer, and then eliminating the sacrificial layer.

AlN, ZnO, LiNb$_3$, LiTa$_3$, PZT, quartz crystal, Ta$_2$O$_5$, or other suitable material is preferably used as the piezoelectric thin-film 16. The upper electrodes 17s and 17p and lower electrodes 15s and 15p are electrode films made of a conductive material, such as Al, Pt, Au, Mo, W, Ti, Cr, or Ru, and multilayer films thereof.

The frequency adjustment films 18 and 19 are formed only on the upper electrodes 17s and 17p. The thicknesses thereof are adjusted as necessary in order to obtain a desired vibration frequency. While SiO$_2$ or SiN is preferably used as the frequency adjustment films 18 and 19, other insulating materials or conductive materials may be used. On the frequency adjustment films 18 and 19, step portions 18s and 19s are located along perimeters 18x and 19x. Peripheral portions 18a and 19a located outside the step portions 18s and 19s have smaller thicknesses than those of the other portions. The film thicknesses and widths of the peripheral portions 18a and 19a are adjusted into optimum ones so that spurious vibration due to Lamb waves is restrained.

As shown in FIG. 3A-1 through FIG. 3B-2, which are perspective views seen from the thickness direction, the series resonator S1 and parallel resonator P1 are different from each other in the configurations of the upper electrodes 17s and 17p and lower electrodes 15s and 15p.

Figures 1, 3A:
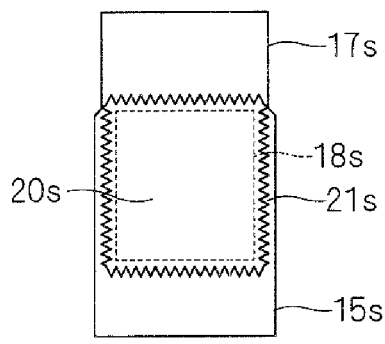
Figures 2, 3A:
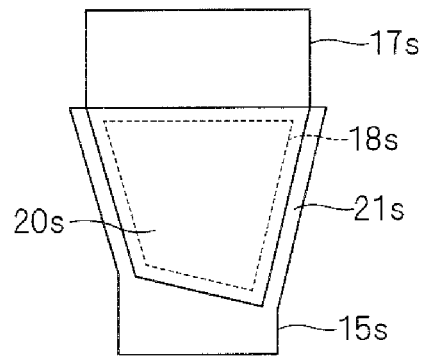

Specifically, for the upper electrode 17s and lower electrode 15s of the series resonator S1, the portions of the perimeters thereof that constitute the perimeter of the vibration portion 20s by overlapping each other are formed in the shape of waves that are repeatedly bent or folded (for example, triangle waves, square waves, or sine waves), as shown in FIG. 3A-1. The shape of the vibration portion 20s is not limited to a rectangle such as a square or a rectangle and may be a shape such as an approximate polygon or an approximate ellipse except for a perfect circle.

As shown in FIG. 3A-2, if the plan view shape of the vibration portion 20s is an irregular polygonal shape, that is, if the plan view shape of the vibration portion 20s is a polygon where each side is non-parallel with the other sides, the portions of the perimeters of the upper electrode 17s and lower electrode 15s constituting the perimeter of the vibration portion 20s are not wave-shaped.

A configuration like that of the above-mentioned series resonator S1 will be referred to as "type A." A type A resonator is a second resonator.

Figures 1, 3B:
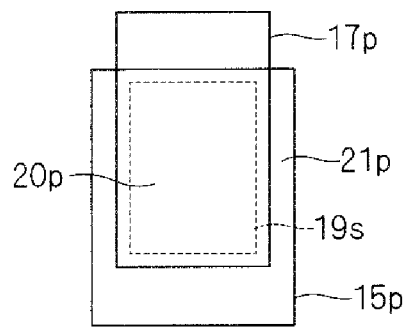
Figures 2, 3B:
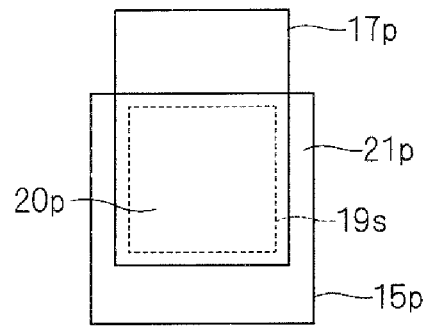

On the other hand, for the upper electrode 17p and lower electrode 15p of the parallel resonator P1, the portions of the perimeters thereof constituting the perimeter of the vibration portion 20p by overlapping each other are formed in the shape of lines rather than in the form of waves, as shown in FIGS. 3B-1 and 3B-2.

The shape of the vibration portion 20p is preferably a rectangle shown in FIG. 3B-1 or a rectangle of a square shown in FIG. 3B-2, in particular, a rectangle having the golden ratio (long side-short side ratio of approximately 1:1.6), since the layout and the downsizing are facilitated. However, the shape of the vibration portion 20p is not limited to a rectangle and may be any shape such as a polygon, a circle, or an ellipse.

As shown in FIGS. 3A-2 through 3B-2, in the vibration portions 20s and 20p and the vicinities thereof, the lower electrodes 15s and 15p are wider than the upper electrodes 17s and 17p, respectively. That is, half or more of the overall lengths of the perimeters of the vibration portions 20s and 20p are constituted by the perimeters of the upper electrodes 17s and 17p, respectively. The widths of additional film areas 21s and 21p of the lower electrodes 15s and 15p extending outside the upper electrode 17p around the vibration portions 20s and 20p are both preferably about 10 μm or more, for example.

For the parallel resonator P1, an additional film 22 is disposed in a manner corresponding to the additional film area 21p, as shown in FIG. 2. The additional film 22 is in contact with a perimeter 17x and a perimeter 19x of the upper electrode 17p and a frequency adjustment film 19, respectively, of the parallel resonator P1. Also, the additional film 22 may be formed in such a manner that, in a perspective view from the thickness direction, the additional film 22 is formed also on the upper electrode 17p in contact with the vibration portion 20p and surrounds the entire perimeter of the vibration portion 20p. An insulating film is used as the additional film 22. The film thickness of the additional film 22 is adjusted into an optimum one so that spurious vibration due to Lamb waves is restrained and so that energy is trapped. If the additional film is formed in a manner extending out of the gap in a perspective view from the thickness direction, heat that has occurred in the vibration portion is effectively transmitted out of the gap via the additional film. Thus, the heat dissipation effect can be enhanced.

A configuration like that of the above-mentioned parallel resonator P1 will be referred to as "type B." A type B resonator is a first resonator.

In FIGS. 3A-1 through 3B-2, step portions 18s and 19s are shown by dotted lines. The frequency adjustment films 18 and 19 are formed in such a manner that these films are completely overlaid on the vibration portions 20s and 20p, respectively.

The shapes of a type A resonator and a type B resonator are defined in photomasks to be used in a photolithography process. When forming the additional film 22 on a portion of the type B resonator after forming layers sequentially, the additional film 22 is not formed on any part of the type A resonator. Since a filter where a type A resonator and a type B resonator are combined can be manufactured in the same process as the process of manufacturing a filter including only type B resonators, there is no need to add a particular process.

The following Table 1 shows film configurations of the resonators.

TABLE 1

| | Film thickness (nm) | |
|---|---|---|
| | Series resonator (S1) | Parallel resonator (P1) |
| Frequency adjustment film $SiO_2$ | 100 nm | 100 nm |
| Step etching amount | 20 nm | 20 nm |
| Additional film AlN | 0 | 680 |
| Upper electrode (Ti/Pt/Au/Pt/Ti) | 10/10/60/30/10 | 10/10/60/30/10 |
| AlN | 1580 | 1580 |
| Lower electrode (Ti/Pt/Au/Pt/Ti) | 10/30/60/10/10 | 10/50/60/10/10 |
| $SiO_2$ | 100 | 100 |
| Resonance frequency | 1880 | 1822 |
| Area ($\mu m^2$) corresponding to capacitance of 1 pF | 18000 | 18000 |

Specifically, an $SiO_2$ film with a thickness of about 100 nm is preferably formed as the supporting layer 14, films made of thicknesses Ti, Pt, Au, Pt, and Ti, respectively, are sequentially formed as the lower electrodes 15s and 15p, an AlN film is formed as the piezoelectric thin film 16, films made of Ti, Pt, Au, Pt, and Ti, respectively, are sequentially formed as the upper electrodes 17s and 17p, $SiO_2$ with a thickness of about 100 nm is laminated entirely on the upper electrodes 17s and 17p as the frequency adjustment films 18 and 19. Subsequently, portions corresponding to the peripheral portions 18a and 19a and having a thickness of about 20 nm, for example, of the frequency adjustment films 18 and 19 are eliminated by etching. The series resonator S1 and parallel resonator P1 are different from each other in the film thicknesses of Pt and Au of the lower electrodes 15s and 15p.

In the piezoelectric thin-film filter 10 according to the first preferred embodiment, a type A resonator is used as a resonator having a relatively large characteristic impedance and a type B resonator is used as a resonator having a relatively small characteristic impedance.

A characteristic impedance $Z(\Omega)$ is obtained by the following Formula I using a resonance frequency f (Hz) and a resonator capacitance C (F) determined by a vibration portion where an upper electrode and a lower electrode are stacked with a piezoelectric thin-film therebetween.

$$Z = 1/(2 \times \pi \times f_s \times C_0) \quad (1)$$

In other words, a type A resonator is used as a resonator having a relatively small resonator capacitance and a type B resonator is used as a resonator having a relatively large resonator capacitance.

A reference value for determining whether the resonator capacitance is large or small varies with the operating frequency. For the resonators in a band of 2 GHz shown in Table 1, the reference value for determining whether the resonator capacitance is large or small is about 1.2 pF and the reference value for determining whether the characteristic impedance is large or small is about 70Ω, for example.

The series resonator S1 shown in Table 1 is a type A resonator having a resonator capacitance of below about 1.2 pF and a characteristic impedance of above about 70Ω, for example. The plan view shape of the vibration portion 20s of the series resonator S1 is an asymmetrical polygon shown in FIG. 3A-2. The parallel resonator P1 shown in Table 1 is a type B resonator having a resonator capacitance of above about 1.2 pF and a characteristic impedance of below about 70Ω, for example. The plan view shape of the vibration portion 20p of the parallel resonator P1 is a square shown in FIG. 3B-2.

By using a type A resonator as a resonator (series resonator S1) having a relatively small resonator capacitance and using a type B resonator as a resonator (parallel resonator P1) having a relatively large resonator capacitance, it is possible to realize a filter where the ripple is small in the passband and the insertion loss is small over the entire passband without increasing the cost.

Figure 4:
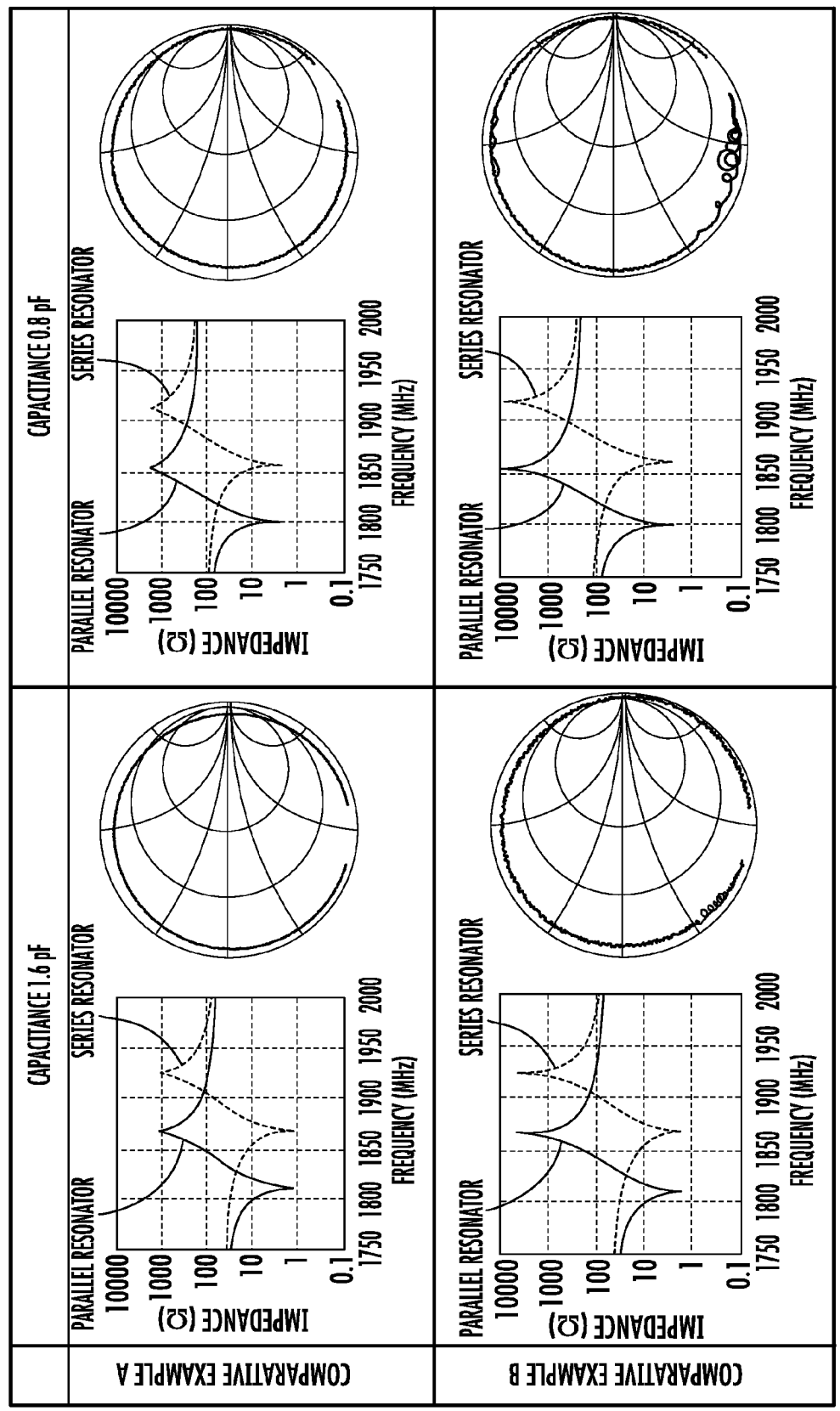
FIG. 4 includes graphs showing resonator characteristics according to comparative examples A and B.

FIG. 4 shows resonance characteristics of filters according to comparative examples A and B. Graphs are impedance curves and Smith charts. The comparative example A is a one-stage, ladder-type filter and uses, as a series resonator thereof and a parallel resonator thereof, type A resonators have same resonator capacitances and each including a vibration portion, a plan view shape of which is an asymmetrical polygon shown in FIG. 3A-2. The comparative example B is a one-stage, ladder-type filter and uses, as a series resonator and a parallel resonator, type B resonators having same resonator capacitances and each including a vibration portion, a plan view shape of which is a square shown in FIG. 3B-2.

From FIG. 4, the following characteristics of the type A resonator and the type B resonator are understood.

For the type A resonators according to the comparative example A, spurious near the resonance point and that near the anti-resonance point are extremely small. For the type B resonators according to the comparative example B, large spurious exists at or below the resonance frequency in a case where the resonator capacitance is small (e.g., about 0.8 pF). On the other hand, in a case where the resonator capacitance is large (e.g., about 1.6 pF), spurious near the resonance point and that at the anti-resonance point are extremely small. The type A resonators (comparative example A) have an anti-resonance Q value smaller than that of the type B resonators (comparative example B). The type A resonators and type B resonators have approximately equal effective electromechanical coupling coefficients (that is, the difference between the resonance frequency and anti-resonance frequency).

As the difference between the resonant resistance and anti-resonance resistance of the resonator is increased, a filter having a higher resonator Q value, a lower insertion loss, and a steeper shoulder characteristic can be realized. Since spurious near the resonance and anti-resonance point in the resonator causes ripple in the passband of the filter, the spurious must be restrained to the minimum.

On the other hand, if a filter can be formed using type B resonators having a resonator capacitance of about 1.6 pF, for example, a filter having good characteristics can be manufactured. However, in order to satisfy a specification such as the attenuation amount outside the passband, it is necessary to manufacture a filter by combining resonators having various resonator capacitance values including a large value and a small value.

Figure 5A:
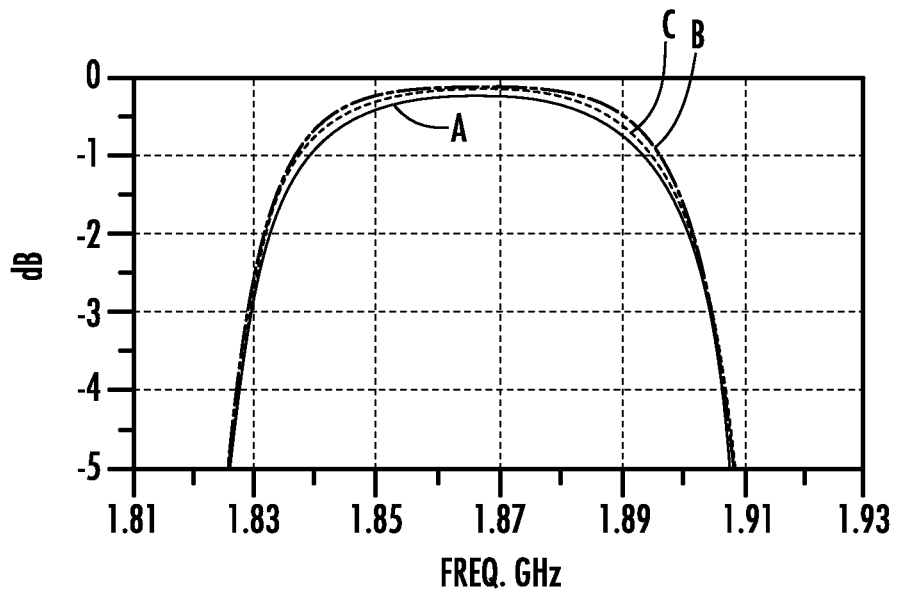
FIGS. 5A and 5B include graphs showing a filter characteristic according to a first comparative example.
Figure 5B:
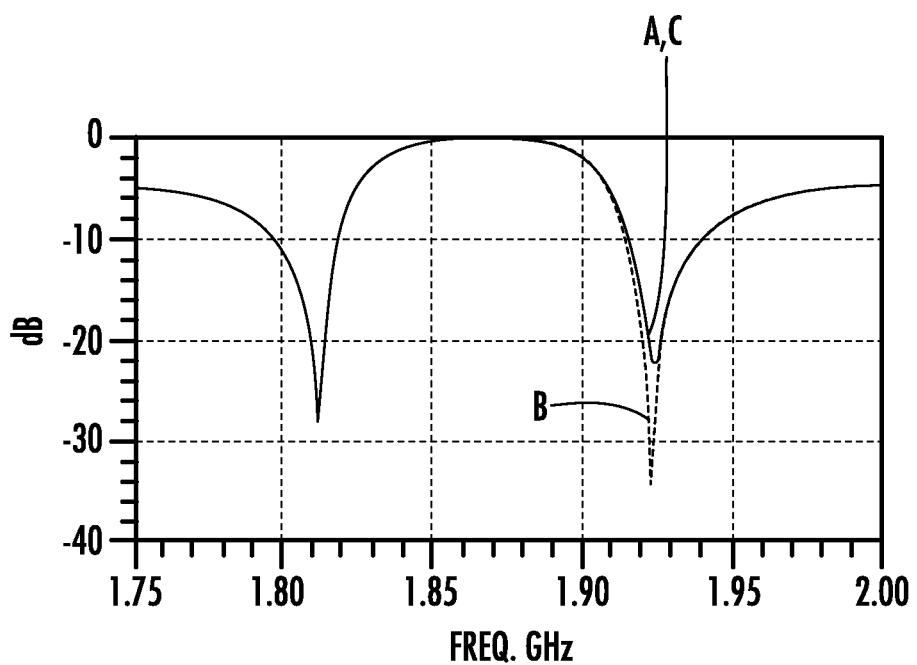

FIGS. 5A and 5B show filter characteristics of a comparative example 1 where a one-stage, ladder-type filter is formed by combining resonators having a resonator capacitance of about 1.6 pF, for example. In the drawing, a character A represents a case (case A) where only type A resonators are used, a character B represents a case (case B) where only type B resonators are used, and a character C represents a case (case C) where a type A resonator is used as a parallel resonator and a type B resonator is used as a series resonator. From FIGS. 5A and 5B, it is understood that the ripple and insertion loss in the case B and those in the case C are approximately the same as each other.

Figure 6A:
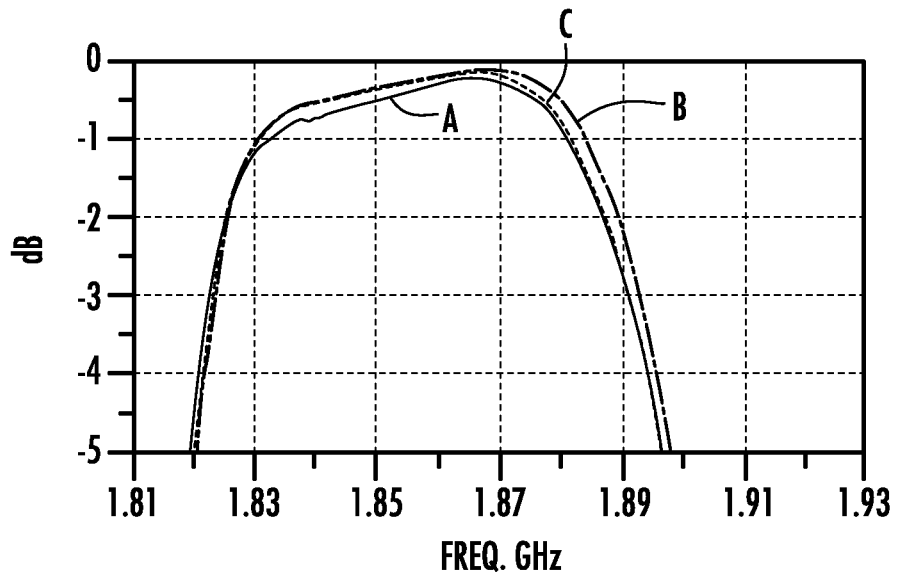
FIGS. 6A and 6B include graphs showing a filter characteristic according to a second comparative example.
Figure 6B:
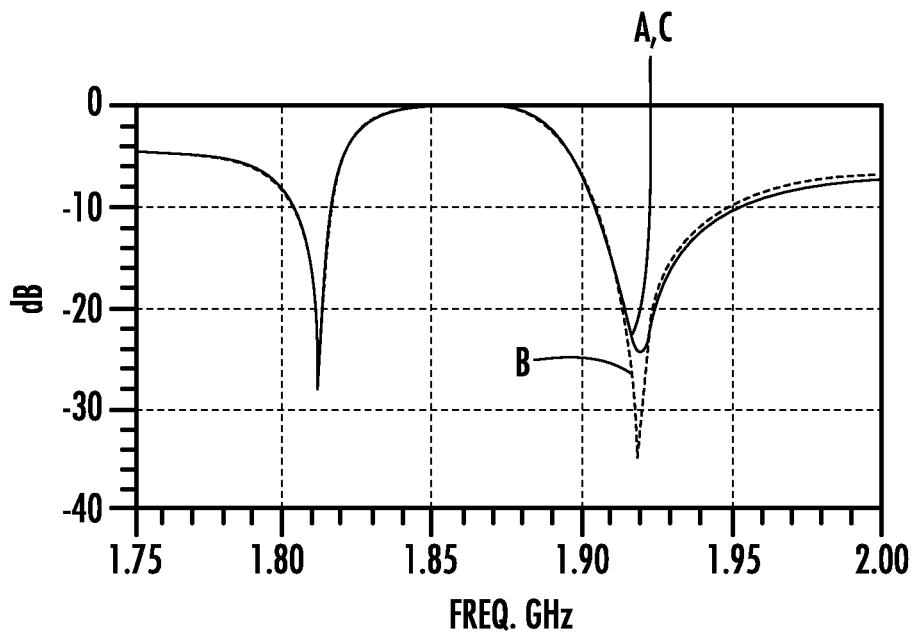

FIGS. 6A and 6B show filter characteristics of a comparative example 2 where a one-stage, ladder-type filter is formed by combining resonators having a resonator capacitance of about 0.8 pF, for example. A character A represents a case (case A) where only type A resonators are used, a character B represents a case (case B) where only type B resonators are used, and a character C represents a case (case C) where a type A resonator is used as a parallel resonator and a type B resonator is used as a series resonator. From FIGS. 6A and 6B, it is understood that the ripple and insertion loss in the case C are smallest.

From FIGS. 4, 5A and 5B, it is understood that even if a filter is formed using type B resonators having a large antiresonance Q value, the best filter characteristics cannot be obtained and that if a type A resonator is used as appropriate in consideration of spurious characteristics, the best filter characteristics can be obtained.

By using a type A resonator as a resonator (series resonator S1) having a resonator capacitance smaller than the reference value and using a type B resonator as a resonator (parallel resonator P1) having a resonator capacitance larger than the reference value as in the first preferred embodiment, it is possible to realize a filter having smaller ripple in the passband and having a smaller insertion loss over the entire passband without increasing the cost.

Second Preferred Embodiment

As with the filter according to the first preferred embodiment, a filter according to the second preferred embodiment is a one-stage or multiple-stage, ladder-type filter formed by combining a type A resonator and a type B resonator.

The filter according to the second preferred embodiment uses a type A resonator including a vibration portion, a plan view shape of which is an asymmetrical polygon shown in FIG. 3A-2 and a type B resonator including a vibration portion, a plan view shape of which is a square shown in FIG. 3B-2. As with the first preferred embodiment, the second preferred embodiment uses a type A resonator as the series resonator S1 having a resonator capacitance smaller than the reference value (e.g., about 1.2 pF) and a type B resonator as the parallel resonator P1 having a resonator capacitance larger than the reference value (e.g., about 1.2 pF).

As shown in Table 2 below, the filter according to the second preferred embodiment is different from the first preferred embodiment in the film configurations of the resonators.

TABLE 2

| | Film thickness (nm) | |
|---|---|---|
| | Series resonator (S1) | Parallel resonator (P1) |
| Frequency adjustment film $SiO_2$ | 100 nm | 100 nm |

TABLE 2-continued

| | Film thickness (nm) | |
|---|---|---|
| | Series resonator (S1) | Parallel resonator (P1) |
| Step etching amount | 20 nm | 20 nm |
| Additional film AlN | 0 | 900 |
| Upper electrode (Ti/Pt/Au/Pt/Ti) | 10/10/80/70/10 | 10/10/80/70/10 |
| AlN | 1135 | 1135 |
| Lower electrode (Ti/Pt/Au/Pt/Ti) | 10/70/80/10/10 | 10/95/80/10/10 |
| $SiO_2$ | 100 | 100 |
| Resonance frequency | 1880 | 1822 |
| Area ($\mu m^2$) corresponding to capacitance of 1 pF | 13000 | 13000 |

As with the first preferred embodiment, according to the second preferred embodiment, it is possible to realize a filter having smaller ripple in the passband and a smaller insertion loss over the entire passband without increasing the cost. Further, the area required to manufacture a resonator having a resonator capacitance of 1 pF is reduced by about 27% compared with the structure of the first preferred embodiment. Thus, the elements can be downsized. Also, the area of the excitation region may be small. Therefore, the distance over which heat generated in the center of the vibration portion is transmitted to a heat dissipation film part is short. Therefore, the second preferred embodiment is excellent in heat dissipation and power handling capability.

Third Preferred Embodiment

A filter according to the third preferred embodiment will be described with reference to FIGS. 7 to 8.

Figure 7:
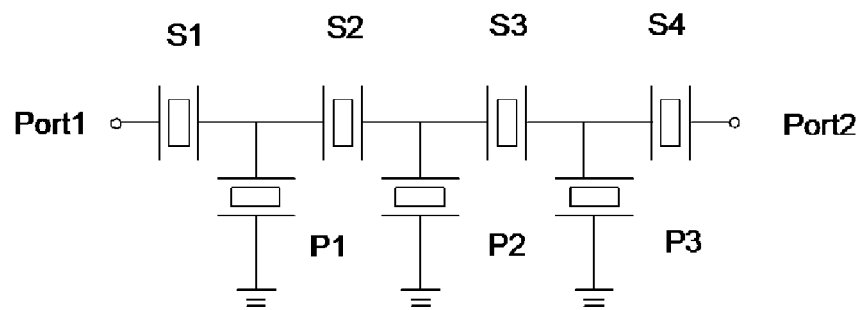
FIG. 7 is a circuit diagram of a piezoelectric thin-film filter according to a third preferred embodiment of the present invention.

As shown in a circuit diagram of FIG. 7, the filter according to the third preferred embodiment preferably is a three-stage, ladder-type filter including series resonators S1 to S4 and parallel resonators P1 to P3. As with the filter according to the first preferred embodiment, the three-stage, ladder-type filter is formed by combining type A resonators and type B resonators. That is, the filter according to the third preferred embodiment uses type A resonators including a vibration portion, a plan view shape of which an asymmetrical polygon shown in FIG. 3A-2 and type B resonators including a vibration portion, a plan view shape of which is a square shown in FIG. 3B-2.

Figure 8:
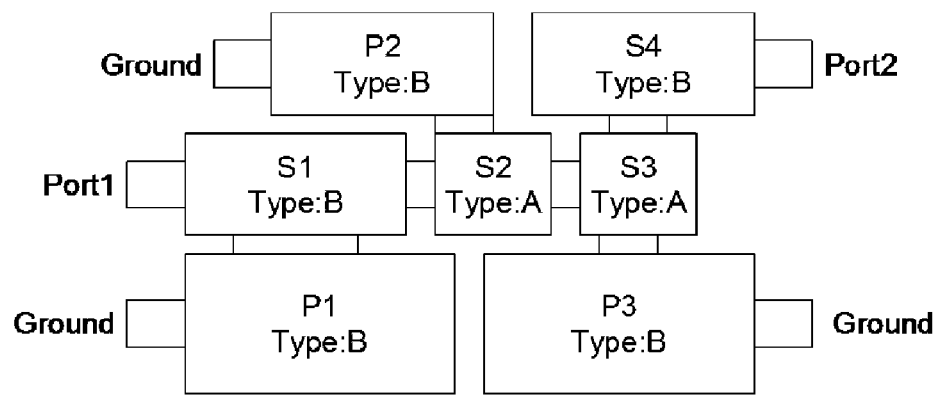
FIG. 8 is a layout diagram showing the deposition of resonators according to the third preferred embodiment of the present invention.

The resonators S1 to S4 and resonators P1 to P3 are disposed as shown in a layout diagram of FIG. 8. In particular, by combining the resonators S1 to S4 and P1 to P3 each including a vibration portion, a plan view shape of which is a square or a rectangle having the golden ratio (long side-short side ratio of approximately 1:1.6), the useless area can be eliminated. Thus, the overall area of the filter can be reduced.

As shown in Table 3 below, type A resonators are used as the resonators S2 and S3 having a resonator capacitance smaller than the reference value (e.g., about 1.2 pF) among the resonators forming the filter, and type B resonators are used as the resonators S1, S4 and P1 to P3 having a resonator capacitance larger than the reference value (e.g., about 1.2 pF) thereamong.

TABLE 3

| | S1 | S2 | S3 | S4 | P1 | P2 | P3 |
|---|---|---|---|---|---|---|---|
| Resonator type | B | A | A | B | B | B | B |
| Capacitance (pF) | 1.7 | 1.1 | 1.1 | 1.7 | 2.2 | 1.7 | 2.2 |
| Area ($\mu m^2$) | 30300 | 19600 | 19600 | 30300 | 39300 | 30300 | 39300 |

Whether type A resonators should be used, how many type A resonators should be used, and what is the resonator capacitance of a resonator to which a type A resonator is to be applied are determined on the basis of whether the ripple criterion in the required specification is satisfied. That is, it is desirable to satisfy the specification while reducing the number of type A resonators as much as possible.

As the film configurations and film thicknesses of the resonators, for example, those according to the first preferred embodiment or second preferred embodiment described in Table 1 or 2 are preferably used.

As with the first preferred embodiment, according to the third preferred embodiment, it is possible to realize a filter having smaller ripple in the passband and a smaller insertion loss over the entire passband without increasing the cost.

Fourth Preferred Embodiment

A filter according to the fourth preferred embodiment will be described with reference to FIGS. 9 to 14.

Figure 9:
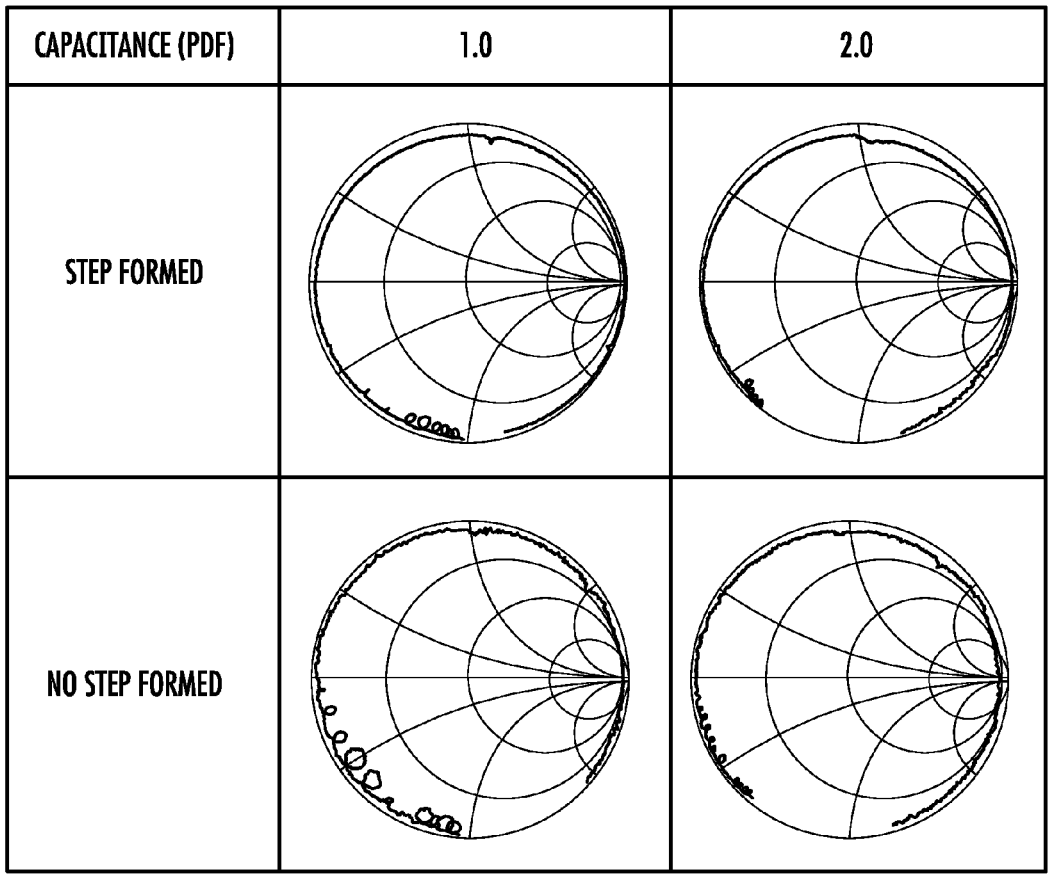
FIG. 9 includes Smith charts of resonators according to a fourth comparative example.

FIG. 9 includes graphs showing the relationship between resonance characteristics of a type A resonator. If the capacitance of the resonator is small (e.g., about 1.0 pF), spurious is increased even if a step is formed on the frequency adjustment film; if the capacitance of the resonator is large (e.g., about 2.0 pF), spurious is reduced.

Figures 1, 10A:
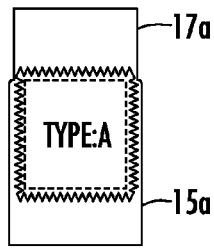
Figures 2, 10A:
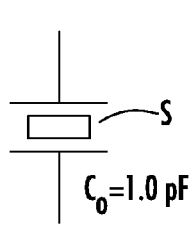
Figures 1, 10B:
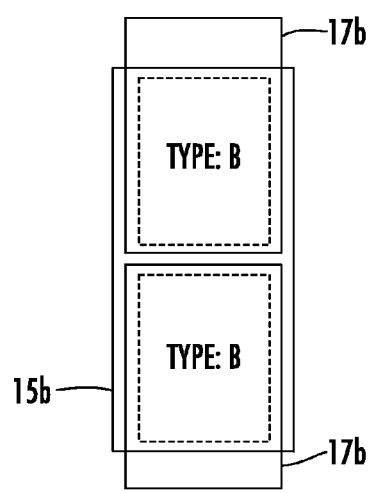
Figures 2, 10B:
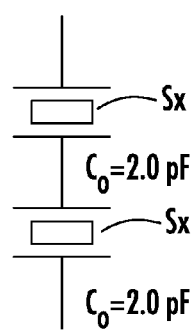

If, using the above-mentioned characteristic that a resonator having a larger capacitance has smaller spurious, a type A resonator S having a small capacitance shown in FIG. 10A-1 is replaced with serially coupled type B resonators SX having a large capacitance shown in FIG. 10B-1 so as to obtain same capacitances, spurious is reduced.

In this case, the number of resonators is increased, so the size of the filter is increased. Therefore, it is preferable to divide only a resonator on which power particularly concentrates and then use type B resonators. For other resonators, it is preferable to use type A resonators as resonators having a small resonator capacitance as long as the ripple characteristics of the filter meet the specification.

Figure 11:
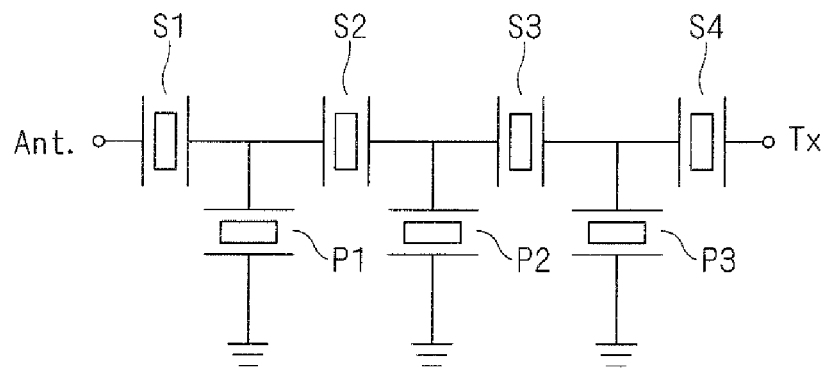
FIG. 11 is a circuit diagram of a piezoelectric thin-film filter according to a reference example.
Figure 12:
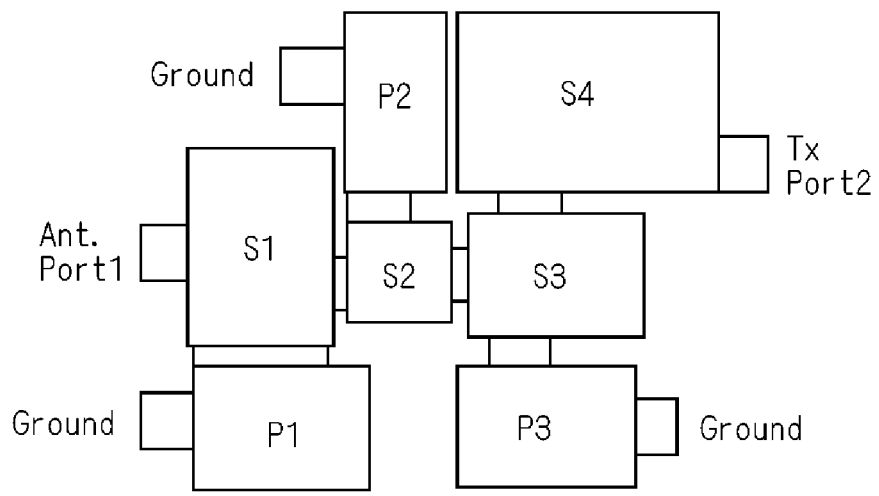
FIG. 12 is a layout diagram of the piezoelectric thin-film filter according to a reference example.
Figure 13:
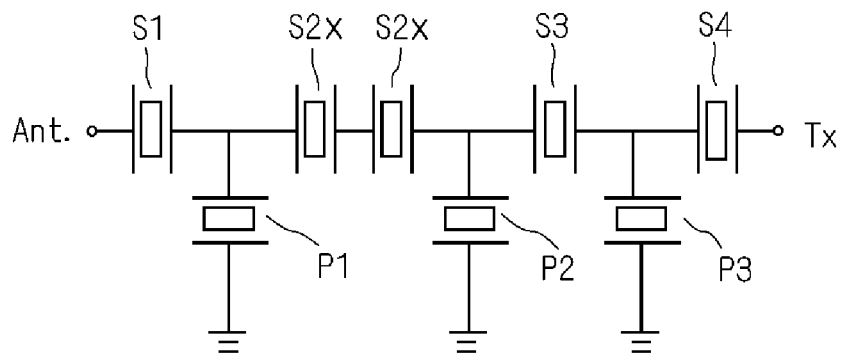
FIG. 13 is a circuit diagram of a piezoelectric thin-film filter according to the fourth preferred embodiment of the present invention.
Figure 14:
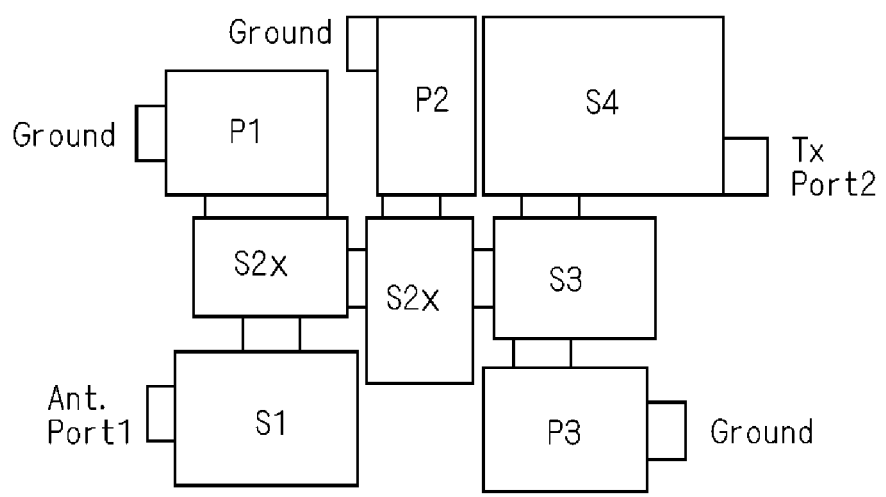
FIG. 14 is a layout diagram of the piezoelectric thin-film filter according to the fourth preferred embodiment of the present invention.

For example, the above-mentioned replacement is applied to a filter according to a reference example, a circuit diagram of which is shown in FIG. 11 and a layout diagram of which is shown in FIG. 12. As shown in the circuit diagram of FIG. 13 and the layout diagram of FIG. 14, a resonator S2 having a small capacitance is divided into serially coupled two resonators S2x. By dividing into two resonators, power consumption per resonator is halved.

This filter is preferably used as a TX filter forming a DPX (duplexer). As the film configuration, that shown in Table 1 of the first preferred embodiment is used. The film configuration shown in Table 2 of the second preferred embodiment may be used.

The capacitance and area of each resonator are as shown in Table 4 below.

TABLE 4

|  | S1 | S2 | S3 | S4 | P1 | P2 | P3 |
|---|---|---|---|---|---|---|---|
| Resonator type | B | B | B | B | B | B | B |
| Capacitance (pF) | 2.5 | 1.1 | 2.1 | 3.2 | 1.9 | 1.7 | 2.1 |
| Area ($\mu m^2$) | 44700 | 19700 | 37600 | 57250 | 34000 | 30400 | 37600 |

The capacitance and area of each resonator are as shown in Table 5 below. The capacitance of each resonator S2x is about 2.2 pF, for example.

TABLE 5

|  | S1 | S2x | S3 | S4 | P1 | P2 | P3 |
|---|---|---|---|---|---|---|---|
| Resonator type | B | B | B | B | B | B | B |
| Capacitance (pF) | 2.5 | 2.2 * 2pc | 2.1 | 3.2 | 1.9 | 1.7 | 2.1 |
| Area ($\mu m^2$) | 44700 | 39400 | 37600 | 57250 | 34000 | 30400 | 37600 |

For the filter according to the fourth preferred embodiment, the filter area is increased so that the cost is increased; however, the filter can be formed without using a type A resonator having a poor resonator Q value. Thus, the insertion loss can be reduced and a steep shoulder characteristic can be realized. Also, since the division of the resonator reduces power to be applied to each of the resultant resonators, the filter according to the fourth preferred embodiment has excellent power handling capability.

Fifth Preferred Embodiment

A configuration of a type A resonator will be described with reference to FIGS. 15A-1 through 15B-3.

Figures 1, 15A:
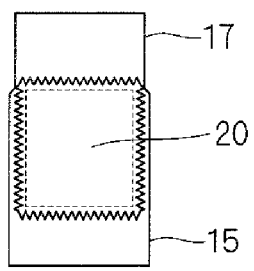
Figures 2, 15A:
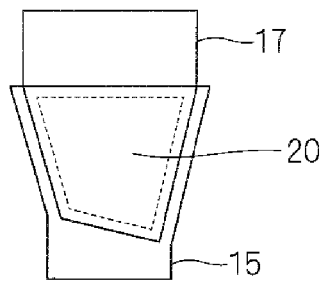
Figures 1, 15B:
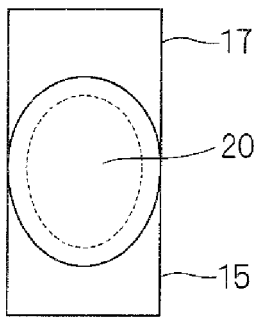
Figures 2, 15B:
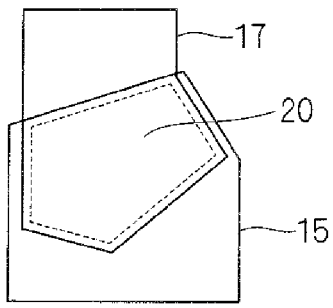
Figures 3, 15B:
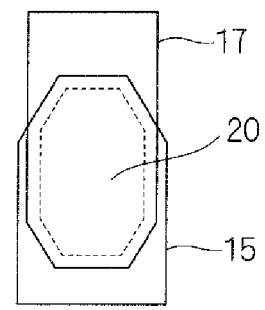

FIGS. 15A-1 through 15B-3 are perspective views of a type A resonator seen from the thickness direction. As shown in FIGS. 15A-1 and 15A-2, a plan view shape of a vibration portion 20 where an upper electrode 17 and a lower electrode 15 are stacked may be a square, a rectangle, or an irregular rectangle. Also, a plan view shape thereof may be an approximately oval shape except for a perfect circle as shown in FIG. 15B-1 or a polygon such as a pentagon or a hexagon as shown in FIG. 15B-2 or 15B-3. A broken line in each drawing represents a step portion of a frequency adjustment film.

The type A resonator having the above-mentioned configuration obtains a resonator characteristic where spurious near the resonance point and the anti-resonance point are extremely small. Therefore, it is preferable to use type A resonators having a plan view shape as shown in FIGS. 15A-1 through 15B-3 as resonators having a small capacitance among resonators forming the filter as long as the ripple characteristics of the filter meets the specification.

Sixth Preferred Embodiment

The shape of a step portion formed on a frequency adjustment film of a type A resonator or a type B resonator will be described with reference to FIGS. 16A-16G.

FIGS. 16A-16G are perspective views of a type B resonator seen from the thickness direction. The frequency adjustment film is formed in such a manner that the film is completely overlaid on the vibration portion 20 where the upper electrode 17 and lower electrode 15 are stacked. A step portion shown by a broken line is formed on the frequency adjustment film. The thickness of a portion of the frequency adjustment film located outside the step portion is smaller than those of the other portions thereof.

Figure 16A:
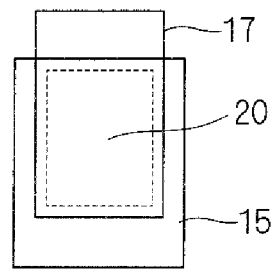
FIGS. 16A-16G include perspective views of resonators according to a sixth preferred embodiment of the present invention.
Figure 16B:
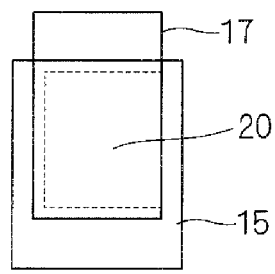
Figure 16C:
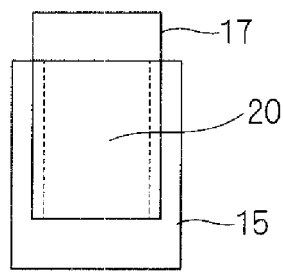
Figure 16D:
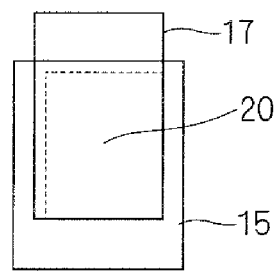
Figure 16E:
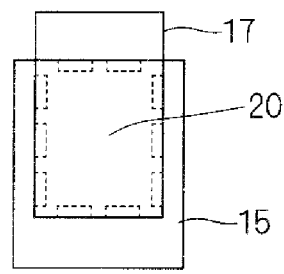
Figure 16F:
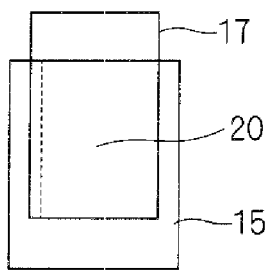
Figure 16G:
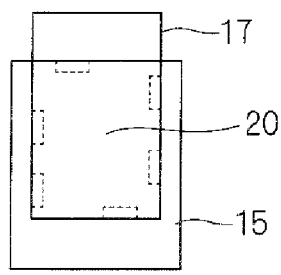

The step portion may be formed along all the sides constituting the perimeter of the frequency adjustment film as shown in FIG. 16A, may be formed continuously along some of the sides constituting the perimeter of the frequency adjustment film as shown in FIGS. 16B, 16C, 16D, and 16F, or may be formed partially along the sides constituting the perimeter of the frequency adjustment film shown in FIGS. 16E and 16G.

Similarly, for a type A resonator, a step portion is formed continuously or partially along the sides constituting the perimeter of the frequency adjustment film.

By providing a step portion on the frequency adjustment film of a type A resonator or a type B resonator, spurious at or below the resonance frequency can be reduced. It is preferable to use type A resonators or type B resonators having a step portion formed thereon so that the ripple characteristics of the filter meets the specification.

Seventh Preferred Embodiment

A filter according to the seventh preferred embodiment will be described with reference to FIGS. 17 to 21. For the filter according to the seventh preferred embodiment, no step is formed on any of the frequency adjustment films of the resonators.

Figure 17:
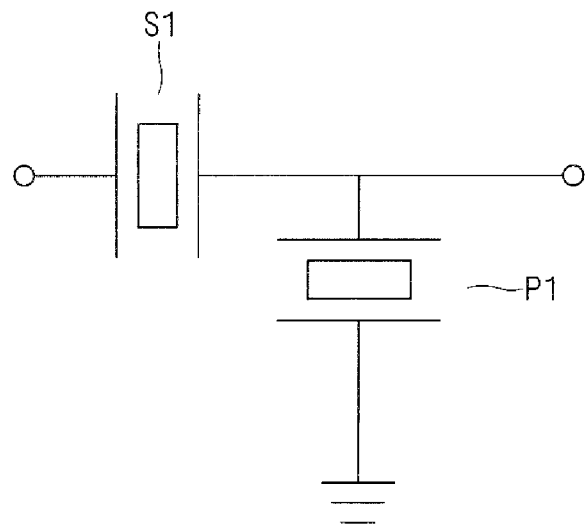
FIG. 17 is a circuit diagram of a piezoelectric thin-film filter according to a seventh preferred embodiment of the present invention.

As shown in a circuit diagram of FIG. 17, the filter according to the seventh preferred embodiment includes a ladder-type filter including the series resonator S1 and parallel resonator P1 and provided in one stage or two or more stages, as with the first to sixth preferred embodiments.

Figure 18:
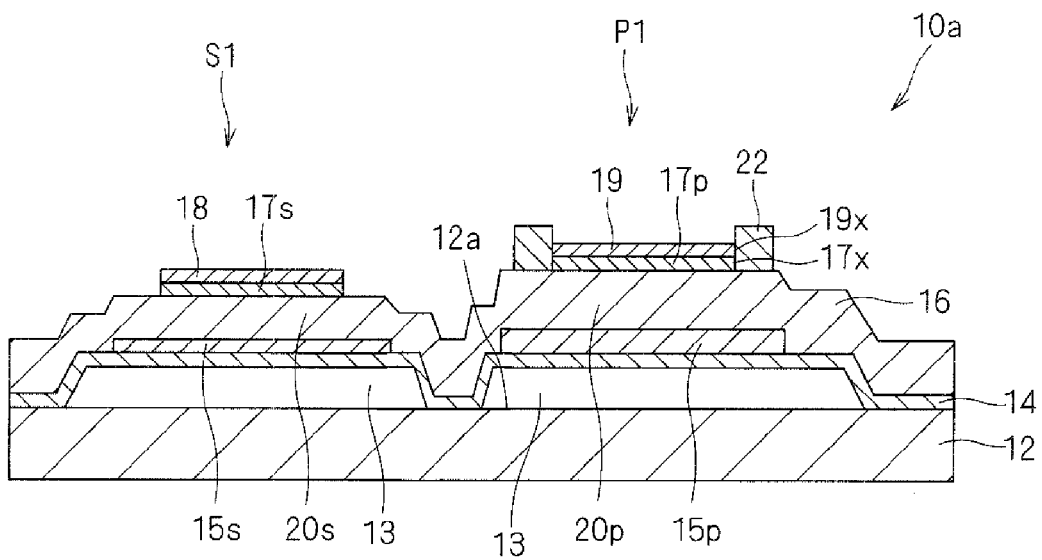
FIG. 18 is a sectional view of the piezoelectric thin-film filter according to the seventh preferred embodiment of the present invention.

As shown by a sectional view of FIG. 18, no step is formed on any of the frequency adjustment films 18 and 19 of the resonators S1 and P1 unlike the first to sixth preferred embodiments. That is, the frequency adjustment films 18 and 19 each preferably have the same thicknesses from the center thereof to the perimeter thereof.

The film configurations of the resonators of the filter according to the seventh preferred embodiment are as shown in Table 6 below.

TABLE 6

| | Film thickness (nm) | |
|---|---|---|
| | Series resonator (S1) | Parallel resonator (P1) |
| Frequency adjustment film SiO$_2$ | 100 nm | 100 nm |
| Step etching amount | Not applicable | Not applicable |
| Additional film AlN | 0 | 680 |
| Upper electrode (Ti/Pt/Au/Pt/Ti) | 10/10/60/30/10 | 10/10/60/30/10 |
| AlN | 1580 | 1580 |
| Lower electrode (Ti/Pt/Au/Pt/Ti) | 10/30/60/10/10 | 10/50/60/10/10 |
| SiO$_2$ | 100 | 100 |
| Resonance frequency | 1880 | 1822 |
| Area (μm$^2$) corresponding to capacitance of 1 pF | 18000 | 18000 |

Figure 19:
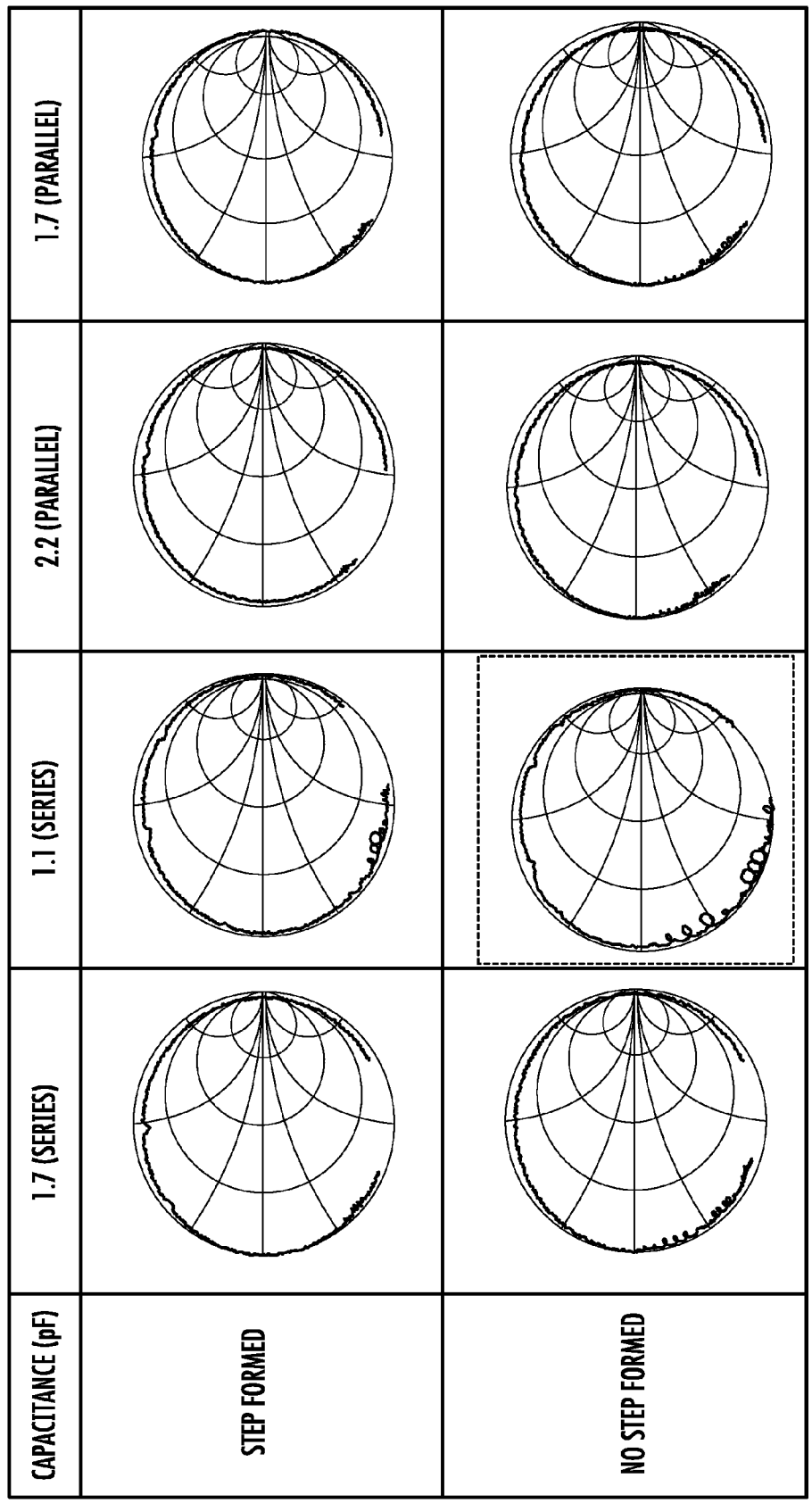
FIG. 19 includes Smith charts of resonators according to a first reference example.

A resonance characteristic (calculated value) in a case where a step is formed on the frequency adjustment film of the type B resonator among the resonators of the filter according to the third preferred embodiment shown in Table 3 or the like and a resonance characteristic (calculated value) in a case where no step is formed thereon are shown in FIG. 19 as a reference example 1. From FIG. 19, it is understood that, for the resonator having a large capacitance, spurious at or below the resonance frequency is small even if no step is formed.

Figure 20:
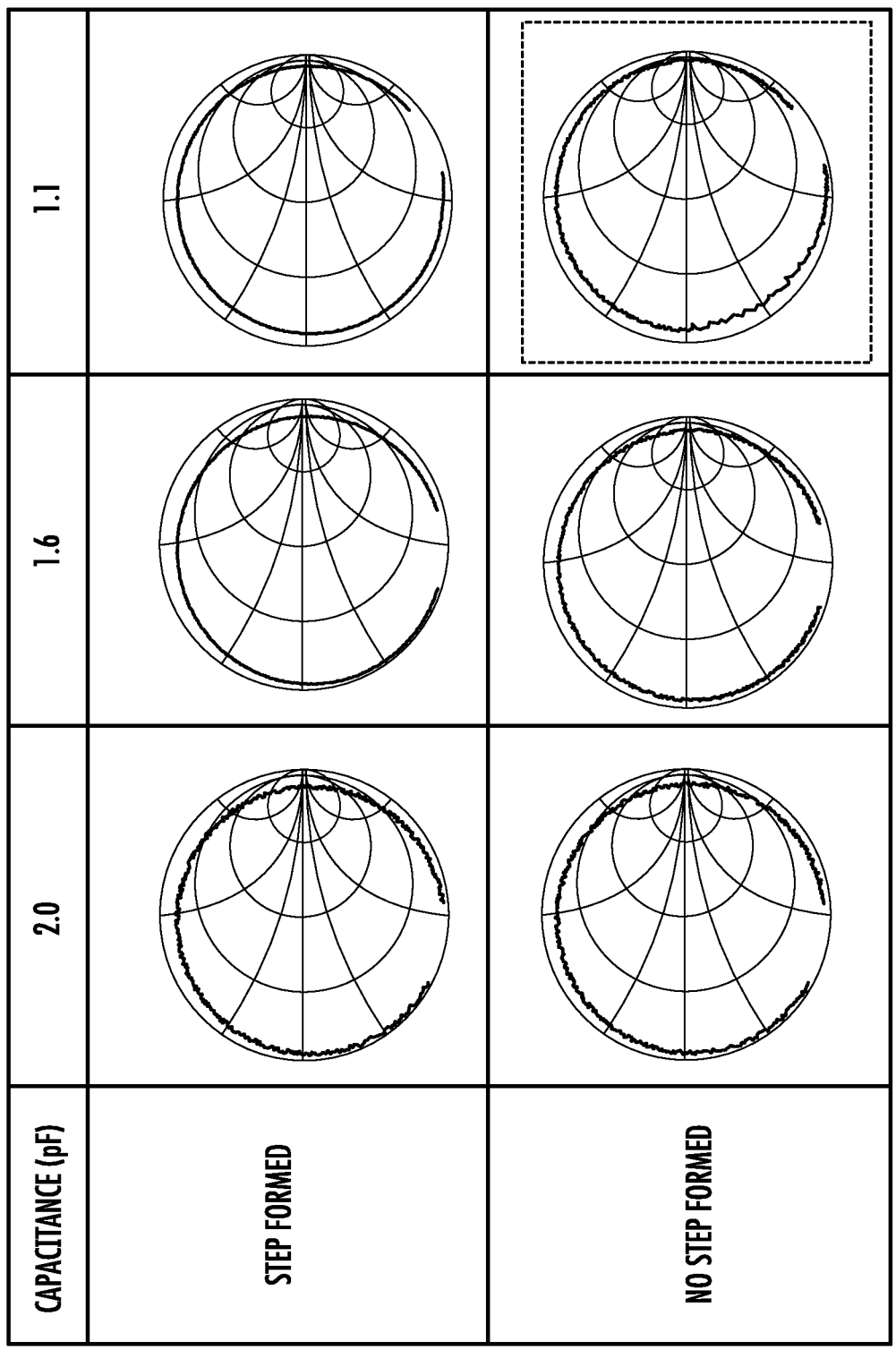
FIG. 20 includes Smith charts of resonators according to a second reference example.

Also, a resonance characteristic (actually measured value) in a case where a step is formed on the frequency adjustment film of the type A resonator among the resonators of the filter according to the third preferred embodiment and a resonance characteristic (actually measured value) in a case where no step is formed thereon are shown in FIG. 20 as a reference example 2.

If no step is formed on any of the frequency adjustment films of the resonators forming the filter according to the third preferred embodiment, the type B resonator having no step and having a capacitance of about 1.1 pF, for example, shows a characteristic that much spurious exists at or below the resonance frequency and a characteristic that the ripple is large within the filter passband, as shown in a manner surrounded by a broken line in FIG. 19. On the other hand, the type A resonator having no step and having a capacitance of about 1.1 pF, for example, shows a characteristic that spurious is small, as shown in a manner surrounded by a broken line in FIG. 20. Therefore, by using the type A resonator having no step as a resonator having a capacitance of about 1.1 pF, for example, the ripple can be reduced.

Figure 21:
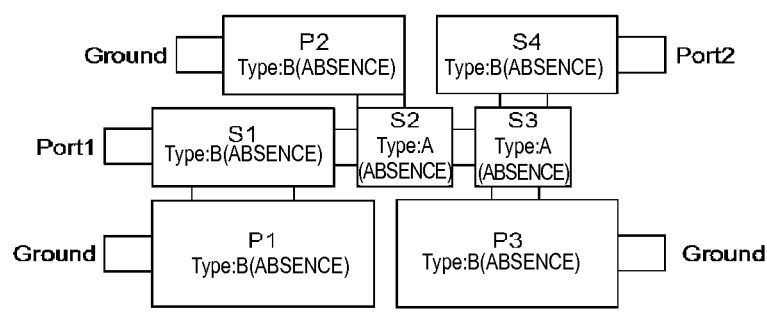
FIG. 21 is a layout diagram of the piezoelectric thin-film filter according to the seventh preferred embodiment of the present invention.

As shown in a layout diagram of FIG. 21, the filter according to the seventh preferred embodiment has approximately the same configuration as that of the third preferred embodiment except that no step is formed on any of the resonators. The phrase "(ABSENCE)" in the drawing indicates that no step is formed.

In the seventh preferred embodiment, it is possible to realize a filter having small ripple in the passband and a small insertion loss over the entire passband without increasing the cost. Further, it is possible to eliminate the step of forming step and thus reduce the cost of the element, since no step is formed on any of the frequency adjustment films of the resonators. Also, it is possible to reduce characteristic variations attributable to a process where misalignment, etching amount variations, or the like must be controlled exactly in the manufacture, such as the step forming process. Thus, the manufacturing margin can be increased.

Eighth Preferred Embodiment

Figure 22:
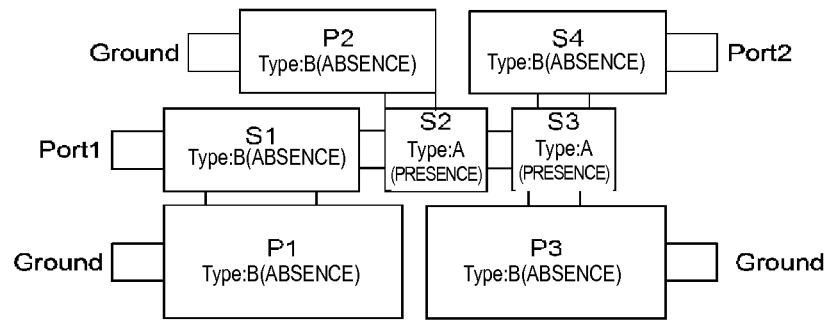
FIG. 22 is a layout diagram of a piezoelectric thin-film filter according to an eighth preferred embodiment of the present invention.

A filter according to the eighth preferred embodiment will be described with reference to FIG. 22.

The filter according to the eighth preferred embodiment has approximately the same configuration as those of the third and seventh preferred embodiments. However, as shown in a layout diagram of FIG. 22, steps are formed only on the frequency adjustment films of the type A resonators S2 and S3 having a small capacitance, unlike the third and seventh preferred embodiments. The phrase "(PRESENCE)" in the drawing indicates that a step is formed. The phrase "(ABSENCE)" in the drawing indicates that no step is formed.

As described above, for a type B resonator having a small capacitance, spurious at or below the resonance frequency is large even if a step is formed. For this reason, the type B resonators having a small capacitance are replaced with type A resonators. Thus, the ripple in the filter is reduced.

On the other hand, for a type B resonator having a large capacitance, spurious at or below the resonance frequency is small even if no step is formed. Therefore, it can be considered that the ripple in the filter is not affected significantly.

Therefore, characteristic variations due to manufacturing variations are reduced in a case where no step is formed.

From FIG. 20, it is understood that by forming a step on the type A resonator having a small capacitance, the type A resonator shows a characteristic that a Smith chart at or below the resonance frequency creeps along the perimeter and that a the loss is obviously small (Q value is large).

Therefore, by forming step only on type A resonators having a small capacitance, the characteristics can be improved significantly. Thus, as in the first preferred embodiment, it is possible to realize a filter having small ripple in the passband and a small insertion loss over the entire passband without increasing the cost.

Ninth Preferred Embodiment

A configuration where a vibration portion of a resonator is acoustically isolated from a substrate will be described with reference to a sectional view of FIGS. 23A through 23F-2.

FIGS. 23A to 23C show examples where a vibration portion of a resonator where the piezoelectric thin film 16 is interposed between the upper electrode 17 and lower electrode 15 is acoustically isolated from the substrate 12 by providing gaps 13, 12s or 12t between the vibration portion and substrate 12. As with the type A resonator such as the first preferred embodiment, the resonator includes the supporting layer 14, frequency adjustment film 19, and additional film 22. A step is formed on the frequency adjustment film 19.

FIG. 23A is an example where the vibration portion of the resonator is supported in a state where the vibration portion floats above the substrate 12 with the gap 13 therebetween. The gap 13 can be formed by forming a sacrificial layer on the substrate 12, then forming a resonator on the sacrificial layer, and eliminating the sacrificial layer.

FIG. 23B is an example where the vibration portion of the resonator is disposed on a cavity 12s passing through the substrate 12. The cavity 12s can be formed by etching the back side of the substrate on which the resonator is formed, that is, by etching the side of the substrate opposite to the side thereof on which the resonator is formed. In this case, a material resistant to etching is used as the supporting layer 14.

FIG. 23C is an example where the vibration portion of the resonator is disposed on the cavity 12t that is formed on the substrate 12 but does not pass therethrough. The cavity 12t is formed on the substrate 12 in advance. After a resonator is formed with a sacrificial layer embedded in the cavity 12t, the sacrificial layer is eliminated.

FIGS. 23D to 23I show examples where an acoustic reflection layer is disposed between the vibration portion of the resonator and substrate 12. In the acoustic reflection layer, a low-acoustic-impedance layer 30 having a relatively low acoustic impedance and a high-acoustic-impedance layer 32 having a relatively high acoustic impedance are alternately disposed. For example, the acoustic reflection layer can be formed by alternately laminating materials having different acoustic impedances.

FIGS. 23D-1 and 23D-2 show examples where the acoustic reflection layer is formed on an entire surface of the substrate 12 and the vibration portion of the resonator is formed on the acoustic reflection layer. FIGS. 23E-1 and 23E-2 show examples where the acoustic reflection layer is formed in a cavity 12k of the substrate 12 and the vibration portion of the resonator is formed on the acoustic reflection layer. FIGS. 23F-1 and 23F-2 show examples where the acoustic reflection layer is formed on a portion of the substrate 12 and the vibration portion of the resonator is formed on the acoustic reflection layer.

FIGS. 23D-1, 23E-1, and 23F-1 are configurations suitable for a type B resonator. The additional film 22 in contact with the perimeters of the upper electrode 17 and frequency adjustment film 19 is formed.

FIGS. 23D-2, 23E-2, and 23F-2 are configurations suitable for a type A resonator. A step portion 18k is formed in such a manner that the thickness of a portion close to the perimeter, of the frequency adjustment film 18 disposed on the upper electrode 17 is larger than those of the other portions thereof.

Tenth Preferred Embodiment

Figure 24:
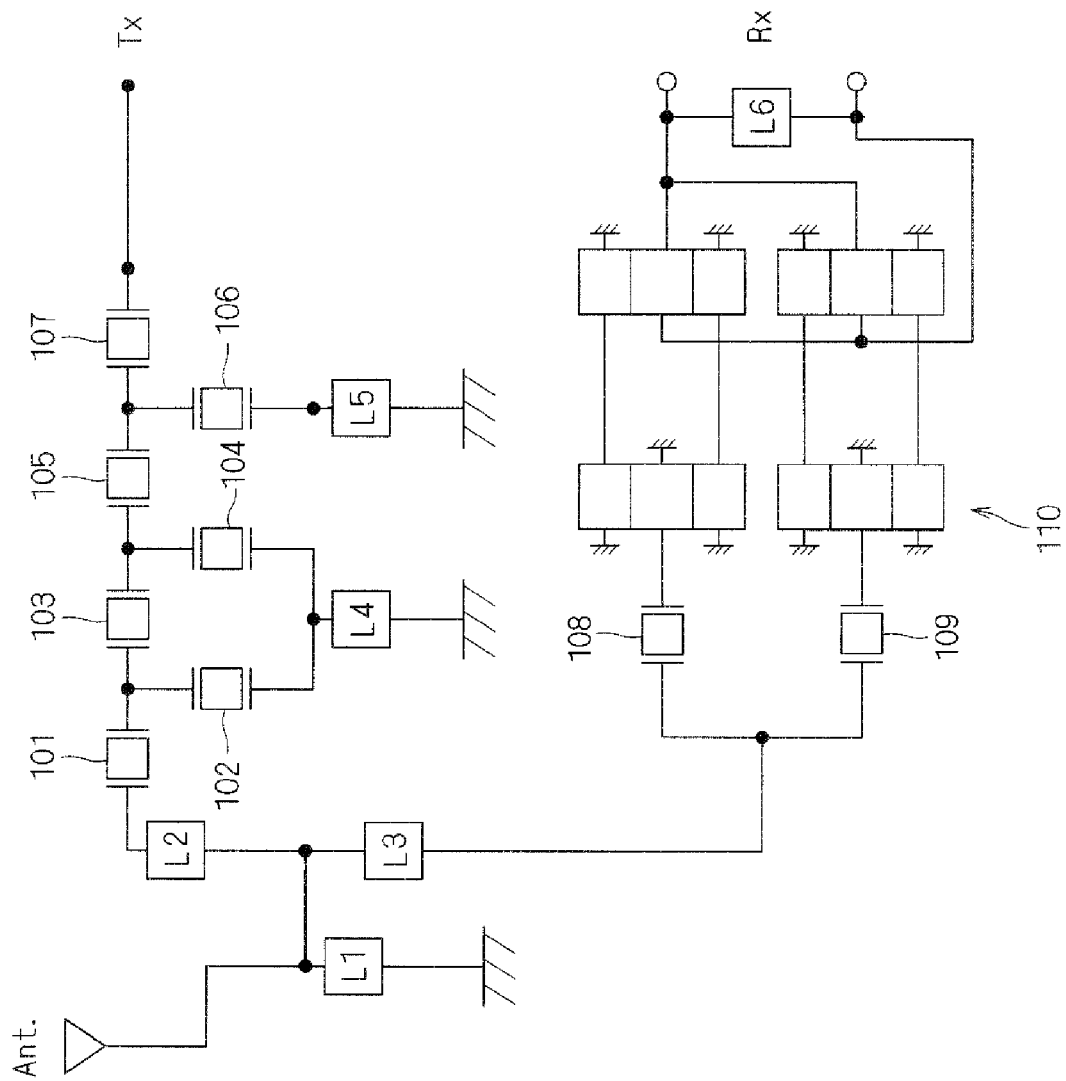
FIG. 24 is a circuit diagram showing a configuration of a DPX according to a tenth preferred embodiment of the present invention.

In the tenth preferred embodiment, a DPX (duplexer) is configured as shown in a circuit diagram of FIG. 24 using piezoelectric resonators/filters 101 to 109 shown in the first to ninth preferred embodiments and inductors L1 to L6. As the resonators 101 to 109 shown in the diagram, BAW resonators shown in the preferred embodiments may be used or SAW resonators or acoustic boundary wave resonators may be partially used.

The DPX shown in FIG. 24 is configured so as to input or output an unbalanced signal into or from a TX end. By using, as an RX end, a filter 110 having a function of converting an unbalanced signal into a balanced signal (balance signal), such as a longitudinal coupling-type SAW filter or a longitudinal coupling-type acoustic boundary wave filter, the RX end can output a balanced signal. Compared with a case where a longitudinal coupling-type BAW filter is used as the RX filter, a DPX that is low-cost and excellent in the quality of a balanced signal can be manufactured.

Eleventh Preferred Embodiment

Figure 25:
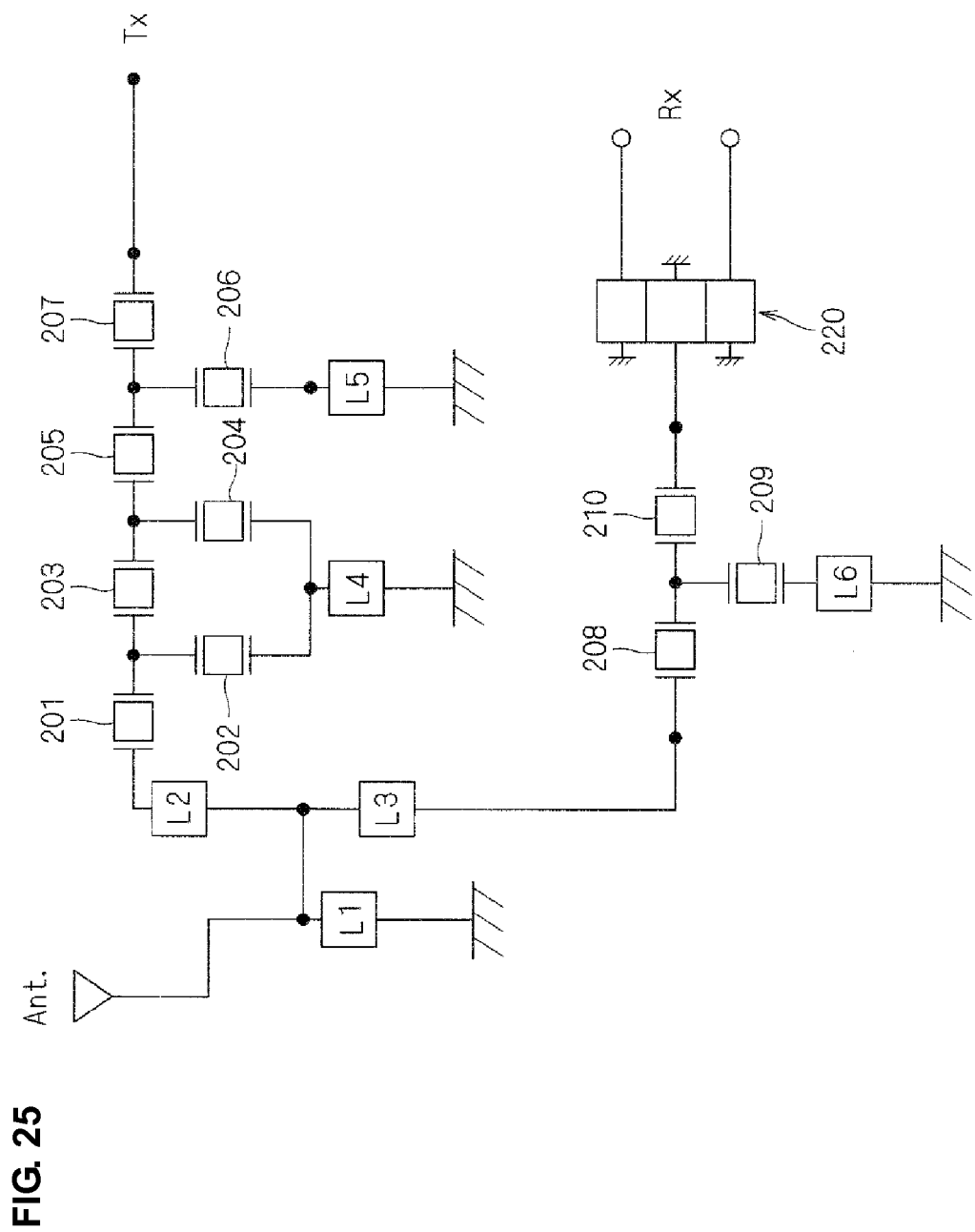
FIG. 25 is a circuit diagram showing a configuration of a DPX according to an eleventh preferred embodiment of the present invention.

In the eleventh preferred embodiment, a DPX (duplexer) is configured as shown in a circuit diagram of FIG. 25 using piezoelectric resonators/filters 201 to 210 shown in the first to ninth preferred embodiments and inductors L1 to L6. As the resonators 201 to 210 shown in the diagram, the BAW resonators shown in the preferred embodiments may be used or SAW resonators or acoustic boundary wave resonators may be partially used.

The DPX shown in FIG. 25 is configured so as to input or output an unbalanced signal to or from the TX end. By using, as the RX end, a filter 220 having a function of converting an unbalanced signal into a balanced signal, such as a longitudinal coupling-type SAW filter or a longitudinal coupling-type acoustic boundary wave filter, and the piezoelectric resonators 208 to 210 shown in the first to ninth preferred embodiments, the RX end can output a balanced signal. Since a BAW filter has a lower loss and a higher Q than a SAW filter as characteristics thereof, a DPX that is low-cost and excellent in the quality of a balanced signal can be manufactured as with the tenth preferred embodiment. Also, a DPX having a lower loss and a steeper shoulder characteristic than those of the tenth preferred embodiment as RX filter characteristics thereof can be manufactured.

Twelfth Preferred Embodiment

Figure 26:
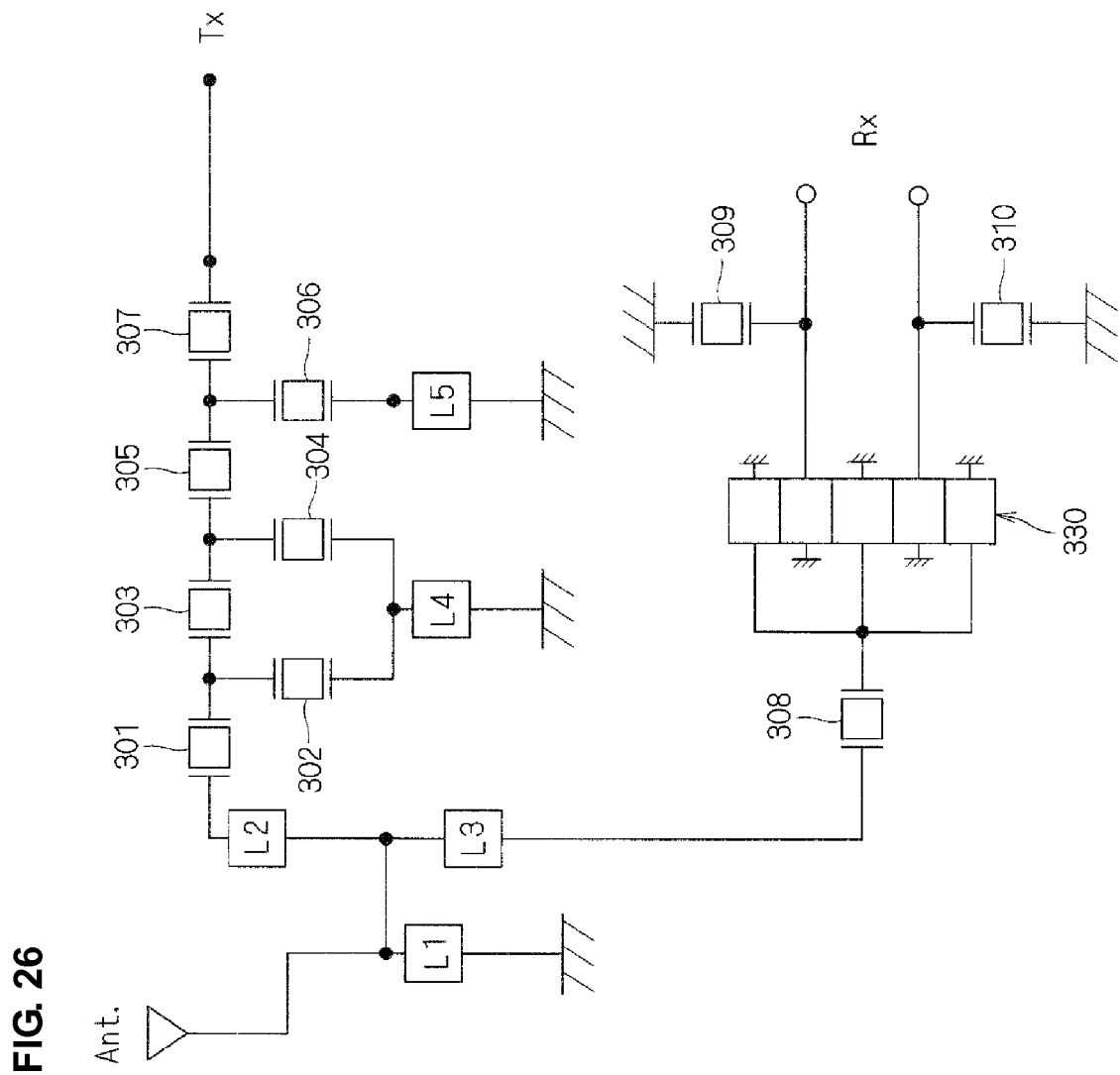
FIG. 26 is a circuit diagram showing a configuration of a DPX according to a twelfth preferred embodiment of the present invention.
Figure 27:
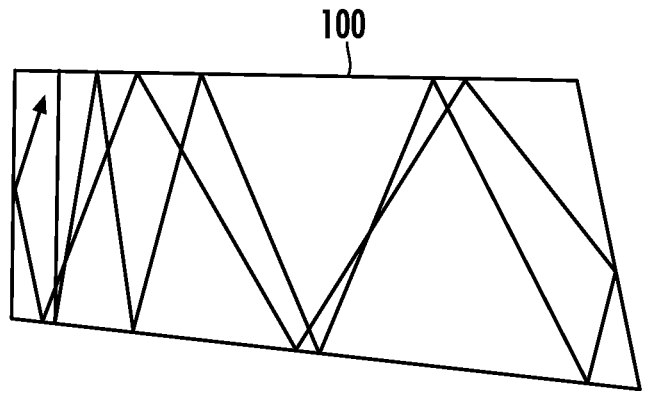
FIG. 27 is a plan view of a piezoelectric thin-film filter according to a first related-art example.
Figure 28:
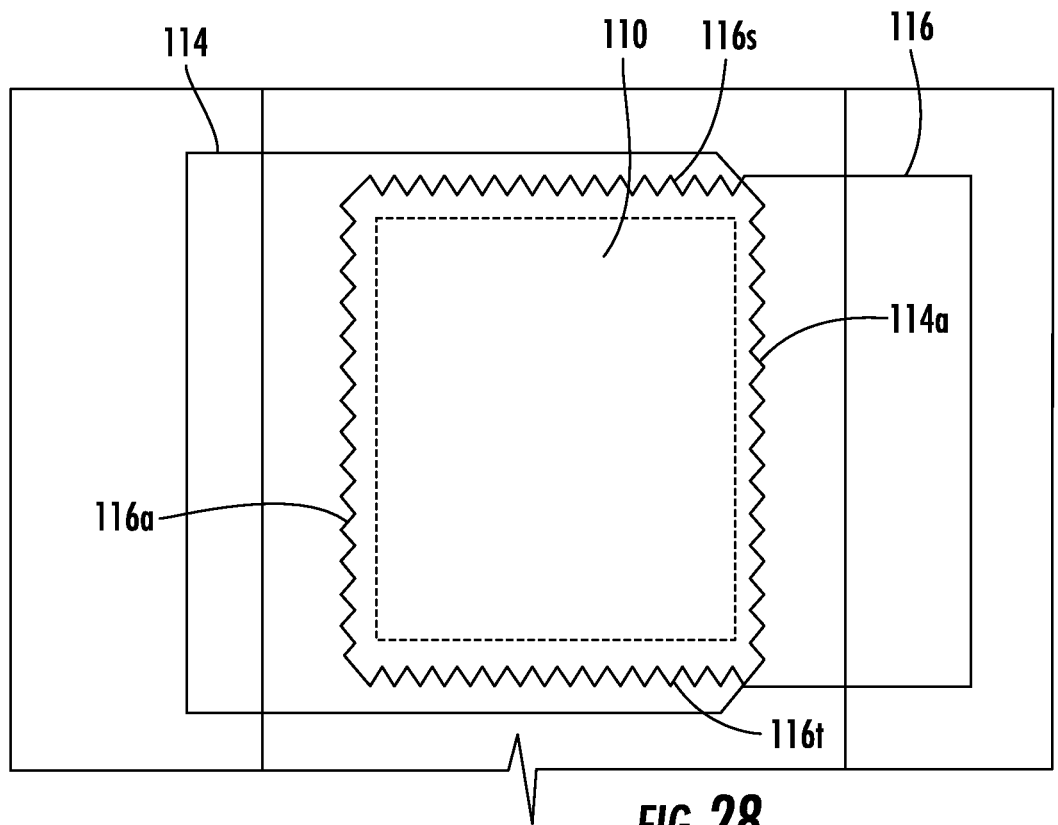
FIG. 28 is a perspective view of a piezoelectric thin-film filter according to a second related-art example.
Figure 29:
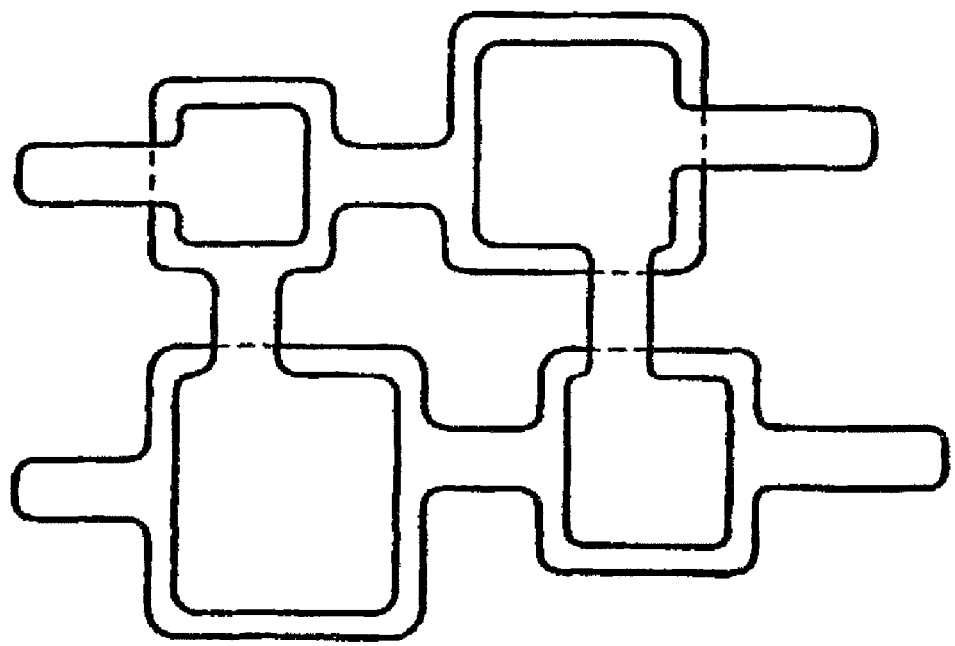
FIG. 29 is a perspective view of a piezoelectric thin-film filter according to a third related-art example.

In the twelfth preferred embodiment, a DPX (duplexer) is configured as shown in a circuit diagram of FIG. 26 using piezoelectric resonators/filters 301 to 310 shown in the first to ninth preferred embodiments and inductors L1 to L5. As the resonators 301 to 310 shown in the diagram, the BAW resonators shown in the preferred embodiments may be used or SAW resonators or acoustic boundary wave resonators may be used as the resonators 308 to 310, which are some of the resonators 301 to 310.

The DPX shown in FIG. 26 is configured so as to input or output an unbalanced signal into or from the TX end. By using, as the RX end, a filter 330 having a function of converting an unbalanced signal into a balanced signal, such as a longitudinal coupling-type SAW filter or a longitudinal coupling-type acoustic boundary wave filter, the RX end can output a balanced signal. Compared with a case where a longitudinal coupling-type BAW filter is used as the RX filter, a DPX that is low-cost and excellent in the quality of a balance signal and where the impedance of an output can be easily adjusted can be manufactured. Also, by incorporating resonators in parallel with to the circuit of the RX end, an excellent electrostatic withstanding characteristic is obtained. In particular, if BAW resonators are used as the resonators 309 and 310, the most excellent electrostatic withstanding characteristic can be obtained.

In FIG. 26, the inductor L1 is disposed in parallel with the circuit of an antenna end so that the matching between the TX filter and RX filter is adjusted. However, instead of the parallel inductor L1, a 90° phase shifter formed using a strip line or the like may be disposed on the path from the antenna to the RX filter.

As described above, by configuring a filter by combining a type A resonator having a relatively large characteristic impedance and a type B resonator having a relatively small characteristic impedance, a piezoelectric thin-film filter having better characteristics can be obtained.

The present invention is not limited to the above-mentioned preferred embodiments. These preferred embodiments may be modified in various ways and then carried out.

For example, the present invention is applicable not only to ladder-type filters but also to lattice-type filters, multiplex mode filters, and the like.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A piezoelectric thin-film filter comprising:
   a substrate;
   at least two pairs of electrodes arranged on a main surface of the substrate; and
   a piezoelectric thin-film disposed between the at least two pairs of electrodes; wherein
   at least one first resonator includes a first vibration portion defined by a first portion of the piezoelectric thin-film disposed between a first pair of the at least two pairs of electrodes and being acoustically isolated from the substrate and at least one second resonator includes a second vibration portion defined by a second portion of the piezoelectric thin-film disposed between a second pair of the at least two pairs of electrodes and being acoustically isolated from the substrate;
   the at least one first resonator includes an additional film that is disposed outside one of the electrodes of the first pair of electrodes constituting about half or more of an overall length of a perimeter of the first vibration portion that is in contact with the one of the electrodes when seen from a thickness direction thereof, and an external shape of the second vibration portion of the at least one second resonator, when seen from a thickness direction thereof, is a polygon and each side of the polygon is not parallel with any of the other sides of the polygon;
   the piezoelectric thin-film filter includes at least two series resonators defined by at least one of the at least one first resonator and at least one of the at least one second resonator; and
   the at least one second resonator does not include the additional film.

2. The piezoelectric thin-film filter according to claim 1, wherein the at least two series resonators include two of the at least one first resonator and two of the at least one second resonator.

3. The piezoelectric thin-film filter according to claim 1, wherein the at least two series resonators include only one of the at least one second resonator and four of the at least one first resonator.

4. The piezoelectric thin-film filter according to claim 1, wherein the at least one first resonator has a relatively low resonance frequency, and the at least one second resonator has a relatively large resonance frequency.

5. The piezoelectric thin-film filter according to claim 1, further comprising a step-formed film overlaid on at least one of the first and second vibration portions when seen from the thickness direction, the step-formed film including a step portion arranged along at least a portion of a perimeter of the at least one of the first and second vibration portions, a thickness of the step-formed film between the step portion and the perimeter of the at least one of the first and second vibration portions being smaller than thicknesses of other portions of the step-formed film.

6. The piezoelectric thin-film filter according to claim 1, further comprising a step-formed film overlaid on only a vibration portion of a resonator having a relatively high characteristic impedance among the at least one first resonator and the at least one second resonator defining the piezoelectric thin-film filter when seen from a thickness direction, the step-formed film including a step portion arranged to extend along at least a portion of a perimeter of the vibration portion, a thickness of the step-formed film between the step portion and the perimeter of the vibration portion being smaller than thicknesses of other portions of the step-formed film.

7. The piezoelectric thin-film filter according to claim 1, wherein
   the at least one first resonator has a relatively small characteristic impedance; and
   the at least one second resonator has a relatively large characteristic impedance.

8. A piezoelectric thin-film filter comprising:
   a substrate; and
   at least two pairs of electrodes arranged on a main surface of the substrate;
   a piezoelectric thin-film disposed between the at least two pairs of electrodes along a main surface of the substrate; wherein
   at least one first resonator includes a first vibration portion defined by a first portion of the piezoelectric thin-film disposed between a first pair of the at least two pairs of electrodes and being acoustically isolated from the substrate and at least one second resonator includes a second vibration portion defined by a second portion of the piezoelectric thin-film disposed between a second pair of the at least two pairs of electrodes and being acoustically isolated from the substrate;
   the at least one first resonator includes an additional film that is disposed outside one of the electrodes of the first pair of electrodes constituting about half or more of an overall length of a perimeter of the first vibration portion that is in contact with the one of the electrodes when seen from a thickness direction thereof, and an external shape of the second vibration portion of the at least one second resonator, when seen from a thickness direction thereof, is an approximate polygon and each side of the approximate polygon has a wave shape that is repeatedly bent or folded; and the piezoelectric thin-film filter includes at least two series resonators including at least one of the at least one first resonator and at least one of the at least one second resonator; and the at least one second resonator does not include the additional film.

9. The piezoelectric thin-film filter according to claim 8, wherein the at least two series resonators include two of the at least one first resonator and two of the at least one second resonator.

10. The piezoelectric thin-film filter according to claim 8, wherein the at least two series resonators include only one of the at least one second resonator and four of the at least one first resonator.

11. The piezoelectric thin-film filter according to claim 8, wherein the at least one first resonator has a relatively low resonance frequency, and the at least one second resonator has a relatively large resonance frequency.

12. The piezoelectric thin-film filter according to claim 8, further comprising a step-formed film overlaid on at least one of the first and second vibration portions when seen from the thickness direction, the step-formed film including a step portion arranged along at least a portion of a perimeter of the at least one of the first and second vibration portions, a thickness of the step-formed film between the step portion and the perimeter of the at least one of the first and second vibration portions being smaller than thicknesses of other portions of the step-formed film.

13. The piezoelectric thin-film filter according to claim 8, further comprising a step-formed film overlaid on only a vibration portion of a resonator having a relatively high characteristic impedance among the at least one first resonator and the at least one second resonator defining the piezoelectric thin-film filter when seen from a thickness direction, the step-formed film including a step portion arranged to extend along at least a portion of a perimeter of the vibration portion, a thickness of the step-formed film between the step portion and the perimeter of the vibration portion being smaller than thicknesses of other portions of the step-formed film.

14. The piezoelectric thin-film filter according to claim 8, wherein the at least one first resonator has a relatively small characteristic impedance; and the at least one second resonator has a relatively large characteristic impedance.

* * * * *